(12) United States Patent
Shih

(10) Patent No.: US 7,259,037 B2
(45) Date of Patent: Aug. 21, 2007

(54) METHOD OF FABRICATING AN X-RAY DETECTOR ARRAY ELEMENT

(75) Inventor: Po-Sheng Shih, Hsinchu (TW)

(73) Assignee: Hannstar Display Corp., Taipei (TW)

( * ) Notice: Subject to any disclaimer, the term of this patent is extended or adjusted under 35 U.S.C. 154(b) by 273 days.

(21) Appl. No.: 10/834,867

(22) Filed: Apr. 30, 2004

(65) Prior Publication Data

US 2004/0203202 A1 Oct. 14, 2004

Related U.S. Application Data

(63) Continuation of application No. 10/367,756, filed on Feb. 19, 2003, now Pat. No. 6,764,900.

(30) Foreign Application Priority Data

Jul. 12, 2002 (TW) .............................. 091115597 A

(51) Int. Cl.
  H01L 21/762 (2006.01)
  H01L 27/088 (2006.01)
  H01T 1/24 (2006.01)
(52) U.S. Cl. ............... 438/55; 250/370.08; 250/370.09
(58) Field of Classification Search .................. 438/66, 438/155; 257/370.08, 370.09; 250/370.08, 250/370.09
  See application file for complete search history.

(56) References Cited

U.S. PATENT DOCUMENTS

| 4,612,629 A | 9/1986 | Harari |
| 5,688,709 A | 11/1997 | Rostoker |
| 6,060,714 A | 5/2000 | Zhong et al. |
| 6,323,490 B1 | 11/2001 | Ikeda et al. |
| 6,423,973 B2* | 7/2002 | Choo et al. ............ 250/370.09 |
| 6,437,341 B1* | 8/2002 | Izumi et al. ........... 250/370.13 |
| 6,440,814 B1 | 8/2002 | Lepert et al. |
| 6,521,924 B2 | 2/2003 | Han et al. |
| 6,723,592 B2 | 4/2004 | Shih |
| 6,764,900 B2 | 7/2004 | Shih |
| 6,797,961 B2* | 9/2004 | Choo et al. ............ 250/370.09 |
| 6,821,832 B2 | 11/2004 | Shih |
| 6,949,426 B2 | 9/2005 | Shih |
| 2001/0018238 A1* | 8/2001 | Kim ........................... 438/145 |

* cited by examiner

Primary Examiner—M. Wilczewski
Assistant Examiner—Pamela E Perkins
(74) Attorney, Agent, or Firm—Thomas, Kayden, Horstemeyer & Risley

(57) ABSTRACT

A method of fabricating an X-ray detector array element. A gate and a gate insulation layer are formed on a substrate. A silicon island is formed on the insulation layer in a transistor area. A common line is formed on the insulation layer, simultaneously; source and drain are formed on the island to form a TFT. A bottom electrode is formed on the insulation layer in a capacitor area and covers the common line. A passivation layer is formed on the insulation layer, the bottom electrode and the TFT. A first via hole penetrates the passivation layer to expose the source. A planarization layer is formed on the passivation layer and fills the first via hole. Second and third via holes penetrate the planarization layer. The second via hole exposes the source. The third via hole exposes part of the passivation layer. A top electrode is formed on the planarization layer and connects the source.

8 Claims, 34 Drawing Sheets

METHOD OF FABRICATING AN X-RAY DETECTOR ARRAY ELEMENT

BACKGROUND OF THE INVENTION

The present invention relates to a method of fabricating an image sensor. More particularly, the invention relates to a method of fabricating an X-ray detector array including a plurality of pixels each including a storage capacitor and a switching thin film transistor (TFT).

Electronic matrix arrays find considerable application in X-ray image sensors. Such devices generally include X and Y (or row and column) address lines transversely and longitudinally spaced apart and across at an angle to one another, thereby forming a plurality of crossover points. Associated with each crossover point is an element (e.g. pixel) to be selectively addressed. These elements in many instances are memory cells or pixels of an electronically adjustable memory array or X-ray imaging array.

Typically, at least one switching or isolation device such as a diode or thin film transistor (TFT) is associated with each array element or pixel. The isolation devices permit the individual pixels to be selectively addressed by the application of suitable potentials between respective pairs of the X and Y address lines. Thus, the TFTs and diodes act as switching elements for energizing or otherwise addressing corresponding memory cells or storage capacitors.

Imagers including arrays of pixels are known in the art, as in U.S. Pat. Nos. 6,020,590, 6,060,714, and 6,124,606, the disclosures of which are incorporated herein by reference. For example, U.S. Pat. No. 6,060,714 discloses an X-ray imager including an array of pixels where each pixel includes a TFT and a storage capacitor including two capacitance portions Cs. See also prior art FIGS. 1, 2A, 2B and 2C.

In FIG. 1, a known X-ray detector for capturing digital radiographic images is illustrated. The X-ray detector includes a plurality of pixels 3 each including a switching thin film transistor (TFT) 5 and a storage capacitor 7. The storage capacitor 7 in each pixel includes a charge collector electrode 4 which functions as a top plate of the storage capacitor, and a pixel electrode 11 which functions as a bottom plate of the capacitor.

FIG. 2A is a top view on an X-ray detector pixel of the prior art. FIG. 2B is a sectional view taken along line C-C' of FIG. 2A. As shown in FIGS. 2A and 2B, each pixel of the prior art includes a substrate 200, a gate electrode 205, a gate line 206, a first gate insulation layer 210, a bottom electrode (a pixel electrode) 215, a second insulation layer 220, an α-Si layer 225, an n⁺ α-Si layer 230, a first via hole 235, a source electrode 240, a drain electrode 245, a data line 250, a common line 255, a planarization layer 260, a second via hole 265, a third via hole 270, a fourth via hole 275 and a top electrode (a charge collector electrode) 280. In addition, symbol Cs indicates a storage capacitor.

The method for fabricating the above comprises seven steps of photolithography and etching. That is, the prior art needs seven reticles or masks. The processing steps are concisely described as follows.

The first photolithography step defines the gate electrode 205 and the gate line 206.

The second photolithography step defines the bottom electrode (a pixel electrode) 215.

The third photolithography step defines the α-Si layer 225 and an n⁺ α-Si layer 230 to obtain a semiconductor island structure.

The fourth photolithography step defines the first via hole 235.

The fifth photolithography step defines the source electrode 240, the drain electrode 245, the data line 250 and the common line 255.

The sixth photolithography step defines the second via hole 265, the third via hole 270 and the fourth via hole 275.

The seventh photolithography step defines the top electrode (a charge collector electrode) 280.

Nevertheless, the method of the prior art has some drawbacks. For example, the dielectric layer of the storage capacitor Cs is the same as the second insulation layer 220 of the TFT, thus, a difference in material thicknesses can not be attained. The storage capacitor Cs is not disposed above the common line 255, thereby wasting space. Since the bottom electrode (a pixel electrode) 215 electrically connects under the common line 255, the method of the prior art is not suitable for gray-tone photolithography of the TFT. Additionally, referring to FIG. 2C, when a passivation layer 290 is formed between the planarization layer 260 and the TFT to protect the channel of the TFT, an extra photolithography process is needed to pattern the passivation layer 290 to form a via hole 295. Thus, the conventional method actually uses eight steps of photolithography.

SUMMARY OF THE INVENTION

The object of the present invention is to provide a method of fabricating an image sensor.

Another object of the present invention is to provide a method of fabricating an X-ray detector array element including a storage capacitor and a thin film transistor (TFT).

To achieve these objects, an exemplary embodiment of the present invention provides a method of fabricating an X-ray detector array element. A substrate having a capacitor area and a transistor area is provided. A transversely extending gate line is formed on the substrate, wherein the gate line includes a gate electrode in the transistor area. A gate insulation layer is formed on the gate line, the gate electrode and the substrate. A semiconducting island is formed on the gate insulation layer in the transistor area. A longitudinally extending common line and a longitudinally extending data line are formed on the gate insulation layer, and simultaneously, a source electrode and a drain electrode are formed on the semiconducting island to form a thin film transistor (TFT) structure, wherein the drain electrode electrically connects the data line. A first conductive layer is formed on the gate insulation layer in the capacitor area and covers the common line. A conformal passivation layer is formed on the gate insulation layer, the first conductive layer, the TFT structure, the data line and the gate line. A first via hole penetrates the passivation layer to expose the surface of the source electrode. A planarization layer is formed on the passivation layer and fills the first via hole. A second via hole and a third via hole penetrate the planarization layer, wherein the second via hole exposes at least the surface of the source electrode, and the third via hole exposes the surface of the passivation layer in the capacitor area. A conformal second conductive layer is formed on part of the planarization layer and electrically connects the source electrode. Thus, a storage capacitor structure composed of the first conductive layer, the passivation layer and the second conductive layer in the capacitor area is obtained.

The present invention also provides an exemplary method of fabricating an X-ray detector array element. A substrate having a capacitor area and a transistor area is provided. A transversely extending gate line is formed on the substrate, wherein the gate line includes a gate electrode in the transistor area. A gate insulation layer is formed on the gate line, the gate electrode and the substrate. A semiconducting layer is formed on the gate insulation layer. A first conductive layer is formed on the semiconducting layer. Using a gray-tone photolithography, part of the first conductive layer and the semiconducting layer is removed to form a longitudinally extending common line on a first semiconducting island, and simultaneously, a source electrode, a drain electrode and a longitudinally extending data line are formed on a second semiconducting island thereby forming a thin film transistor (TFT) structure, wherein the drain electrode electrically connects the data line. A second conductive layer is formed on the gate insulation layer in the capacitor area and covers the common line. A conformal passivation layer is formed on the gate insulation layer, the second conductive layer, the TFT structure, the data line and the gate line. A first via hole penetrates the passivation layer to expose the surface of the source electrode. A planarization layer is formed on the passivation layer and fills the first via hole. A second via hole and a third via hole penetrate the planarization layer, wherein the second via hole exposes at least the surface of the source electrode, and the third via hole exposes the surface of the passivation layer in the capacitor area. A conformal third conductive layer is formed on part of the planarization layer and electrically connects the source electrode. Thus, a storage capacitor structure composed of the second conductive layer, the passivation layer and the third conductive layer in the capacitor area is obtained.

It is to be understood that both the foregoing general description of the invention and the following detailed description are exemplary, but are not restrictive of the invention.

BRIEF DESCRIPTION OF THE SEVERAL VIEWS OF THE DRAWING

The present invention can be more fully understood by reading the subsequent detailed description in conjunction with the examples and references made to the accompanying drawings, wherein:

FIGS. 3A-9A are sectional views of an X-ray detector array element, according to an exemplary embodiment of the present invention, taken along line C-C' of FIGS. 3B-9B;

FIGS. 3B-9B are perspective top views of an X-ray detector array element according to the exemplary embodiment of the present invention;

FIGS. 10A-16A are sectional views of an X-ray detector array element, according to a further exemplary embodiment of the present invention, taken along line C-C' of FIGS. 10B-16B; and FIGS. 10B-16B are perspective top views of an X-ray detector array element according to the further exemplary embodiment of the present invention.

DETAILED DESCRIPTION OF THE INVENTION

Figure 1:
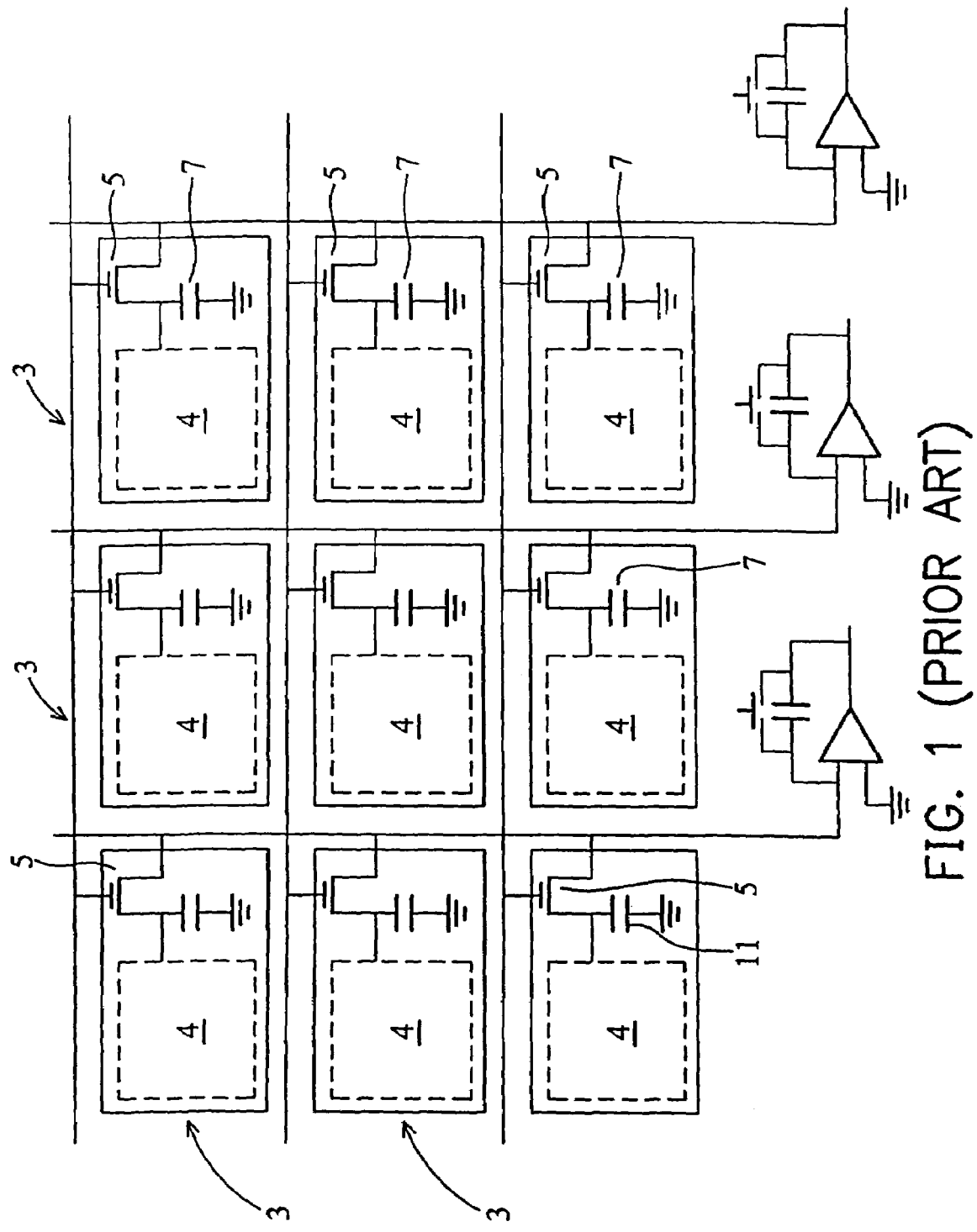
FIG. 1 is a schematic of a prior art imager array wherein each pixel includes a switching TFT and a storage capacitor.
Figure 2A:
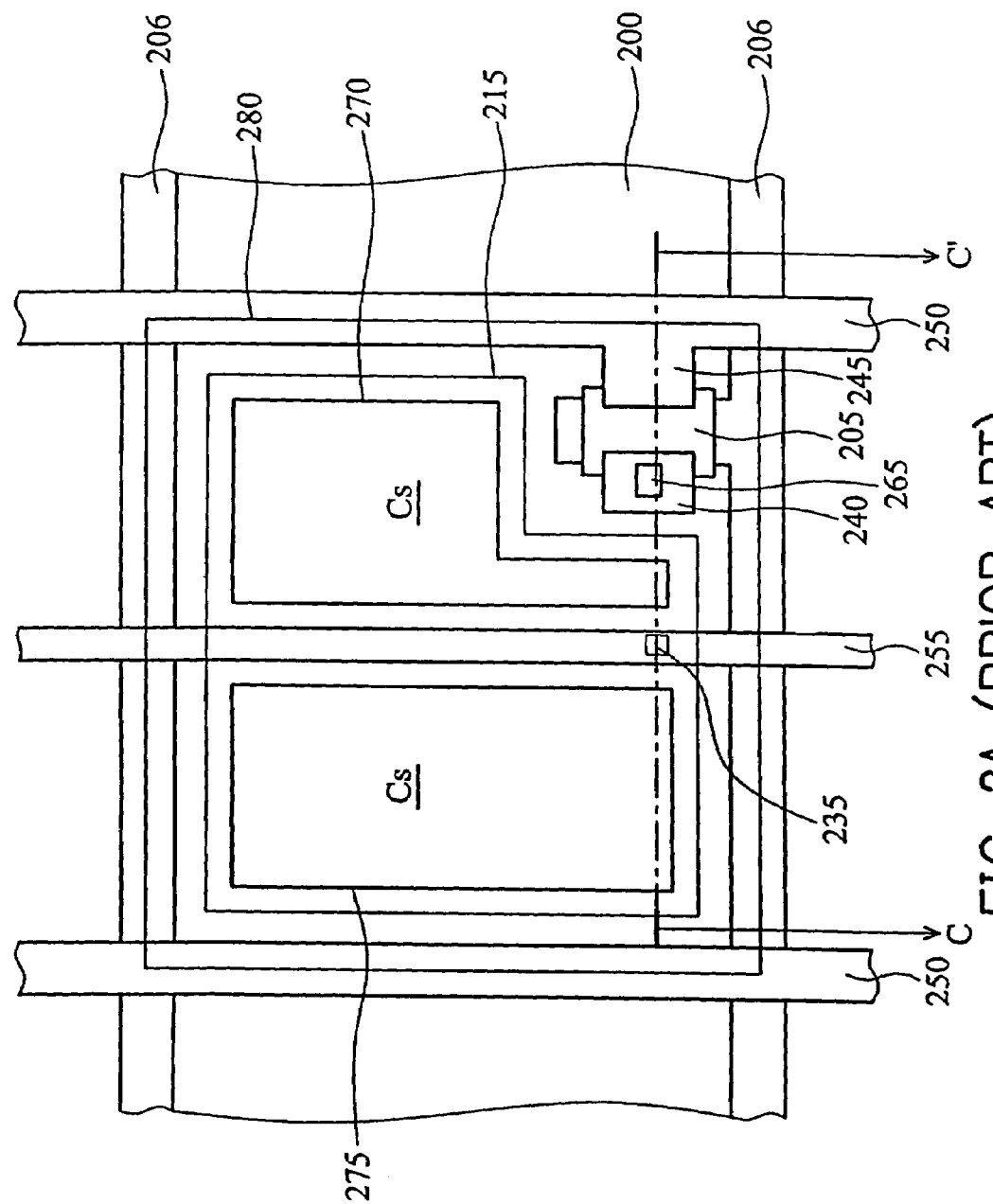
FIG. 2A is a perspective top view on an X-ray detector pixel of the prior art.
Figure 2B:
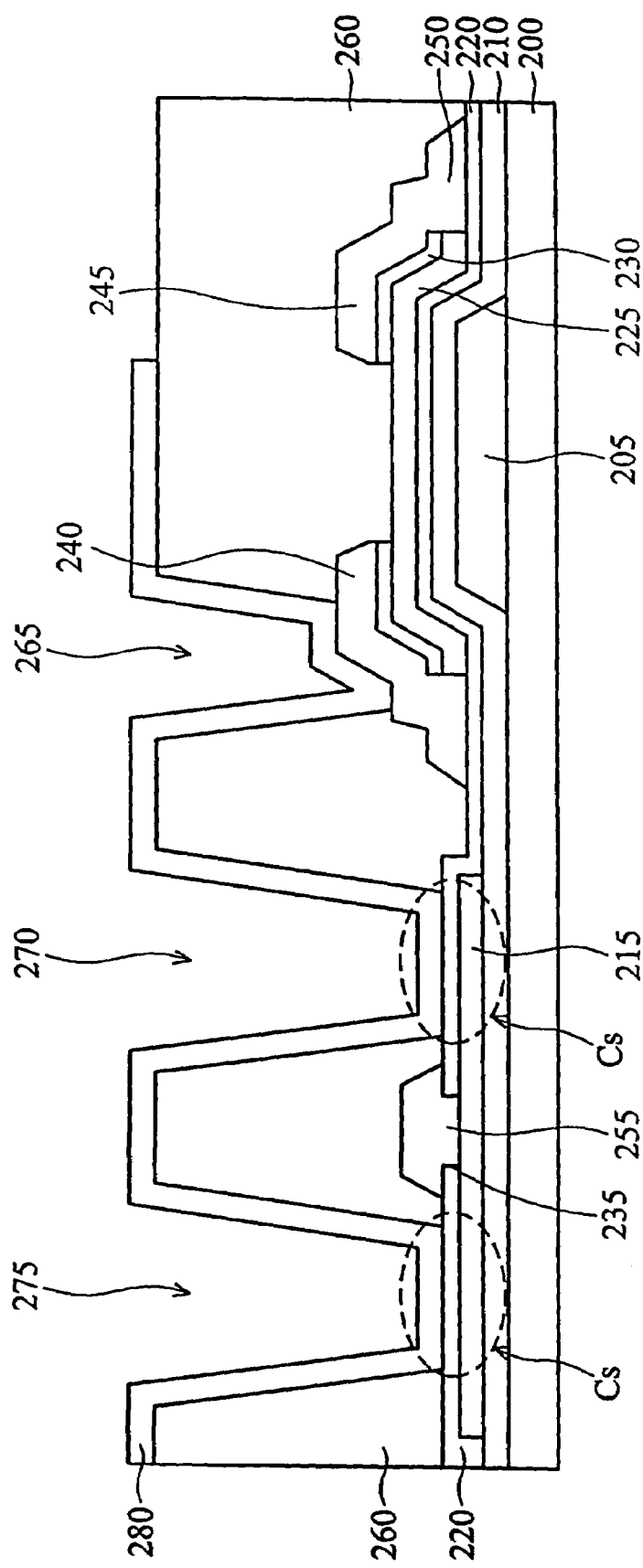
FIG. 2B is a sectional view taken along line C-C' of FIG. 2A.
Figure 2C:
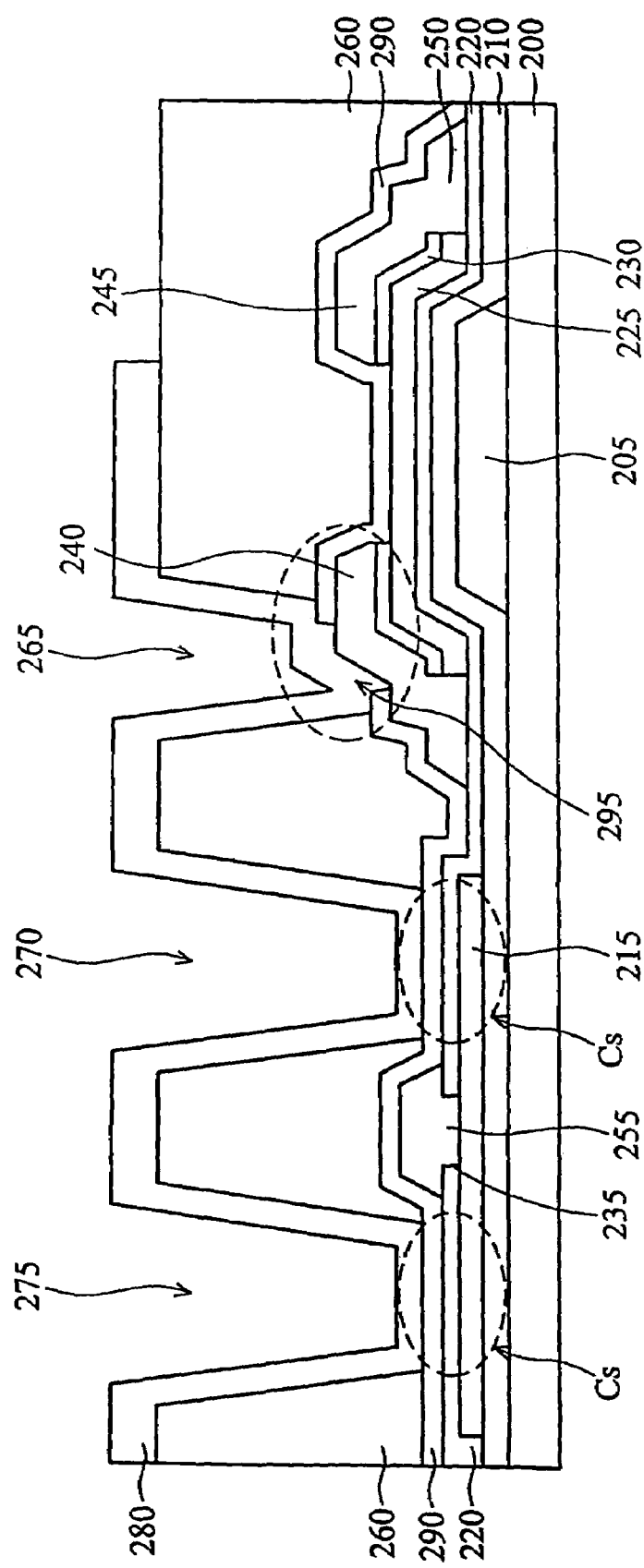
FIG. 2C is a sectional view, according to the traditional process, that illustrates a passivation layer 290 between the planarization layer 260 and the TFT is formed.

In the drawings, the same reference numerals are used for designating the same elements throughout the several figures.

FIGS. 3A-9A are sectional views of an X-ray detector array element, according to an exemplary embodiment of the present invention, taken along line C-C' of FIGS. 3B-9B. FIGS. 3B-9B are top views of an X-ray detector array element according to the first embodiment of the present invention. In order to simplify the illustration, the accompanying drawings show a single pixel region of a substrate. Of course, the number of pixel regions is very large for a typical array.

Figure 3A:
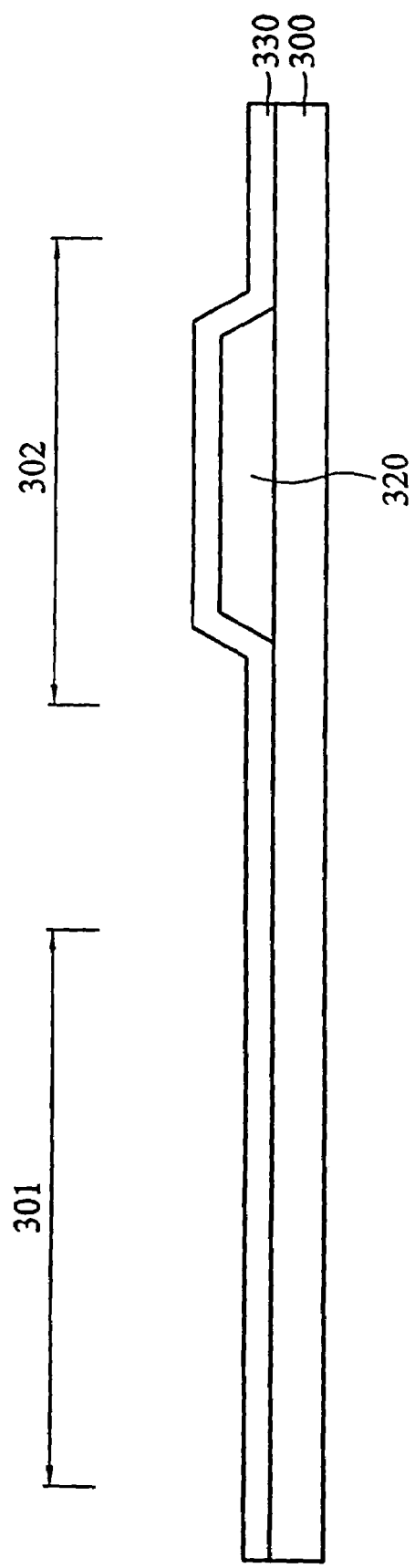
Figure 3B:
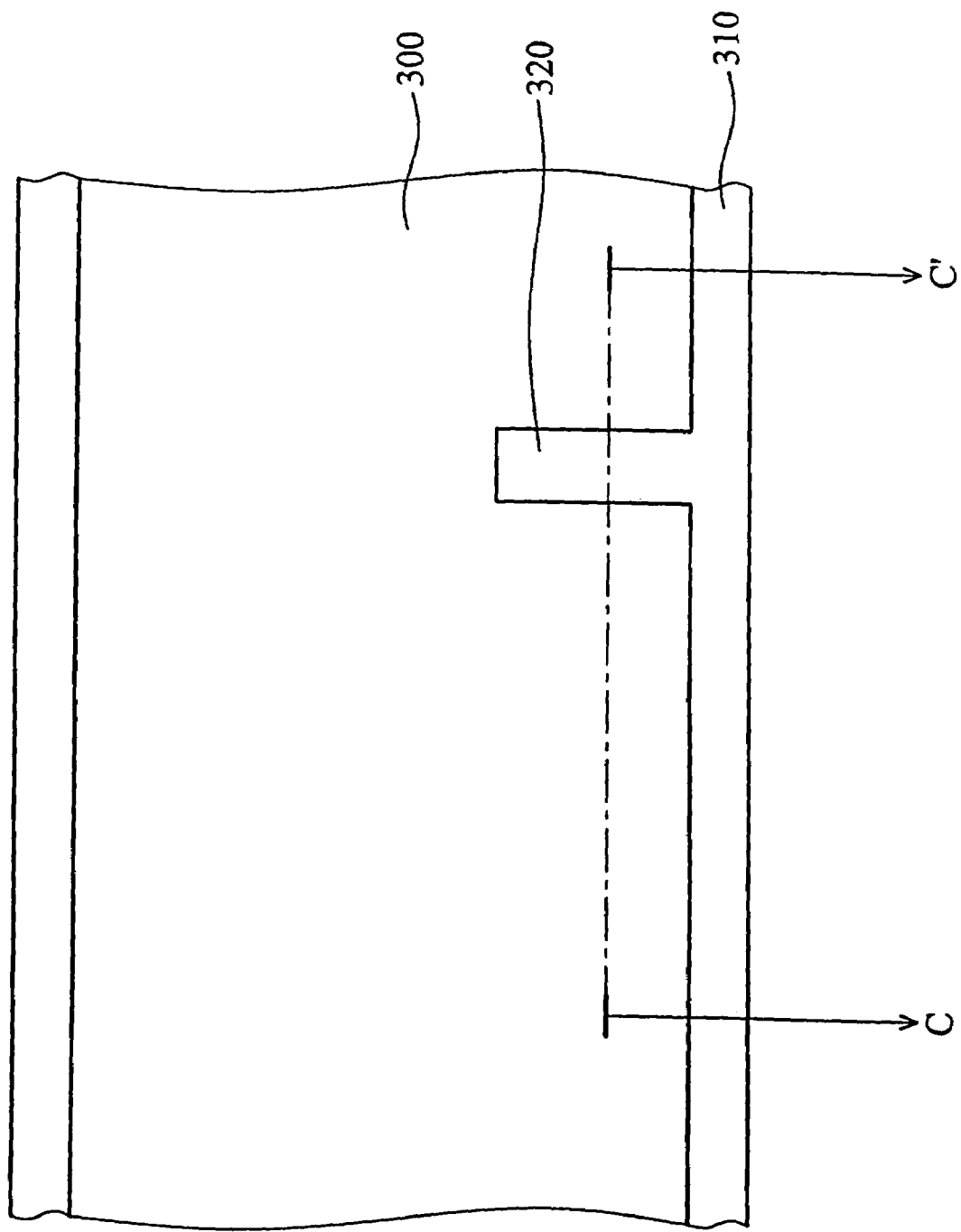

In FIGS. 3A and 3B, a substrate 300, such as a glass substrate, having a capacitor area 301 and a transistor area 302 is provided. Then, deposition and a first photolithography (also called a first photo engraving process, PEP I) are performed, and a transversely extending gate line 310 is formed on the substrate 300. The gate line 310 includes a gate electrode 320 in the transistor area 302.

It should be noted that FIG. 3B shows the gate line 310 having a protruding portion 320 in the transistor area 302, wherein the protruding portion 320 serves as the gate electrode 320. Nevertheless, those skilled in the art will recognize that the description herein is not intended to limit the position of the gate electrode. For example, the gate line 310 located in the transistor area 302 can also serve as the gate electrode 320, as shown in FIGS. 9C and 9D. The illustration of the FIGS. 9C and 9D will be described in the modification of the first embodiment.

In FIGS. 3A and 3B, a gate insulation layer 330 of the exemplary embodiment is formed on the gate line 310, the gate electrode 320 and the substrate 300. The gate line 310 and the gate electrode 320 may be metal formed by deposition. The gate insulation layer 330 maybe $SiO_2$, $SiN_x$ or SiON formed by deposition.

Figure 4A:
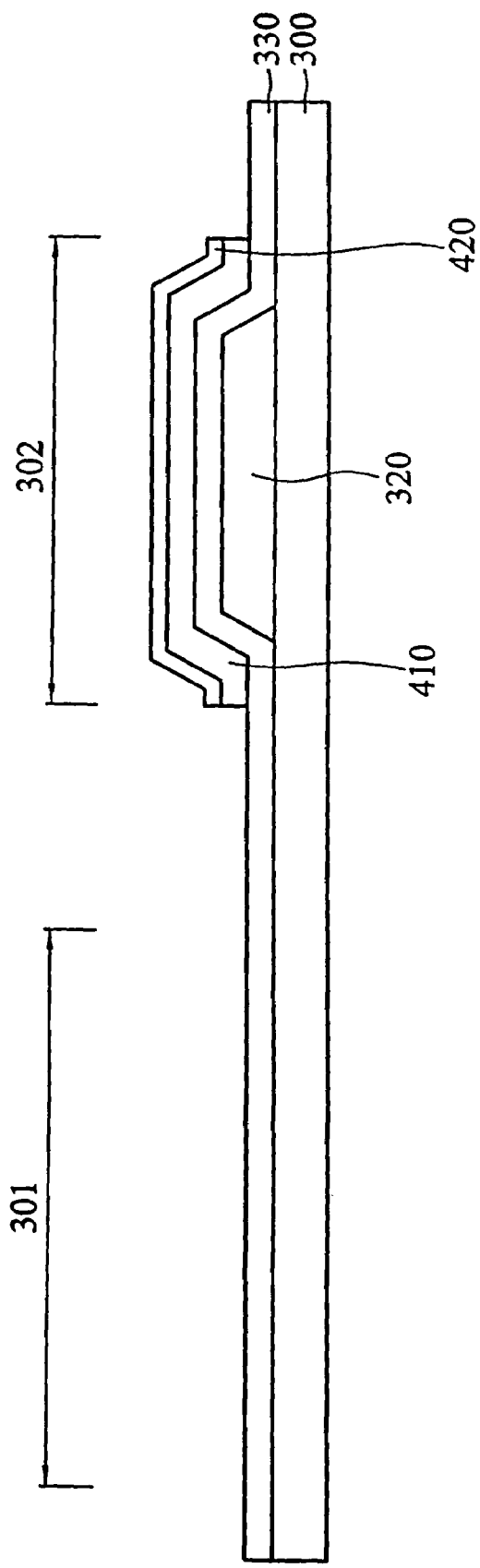
Figure 4B:
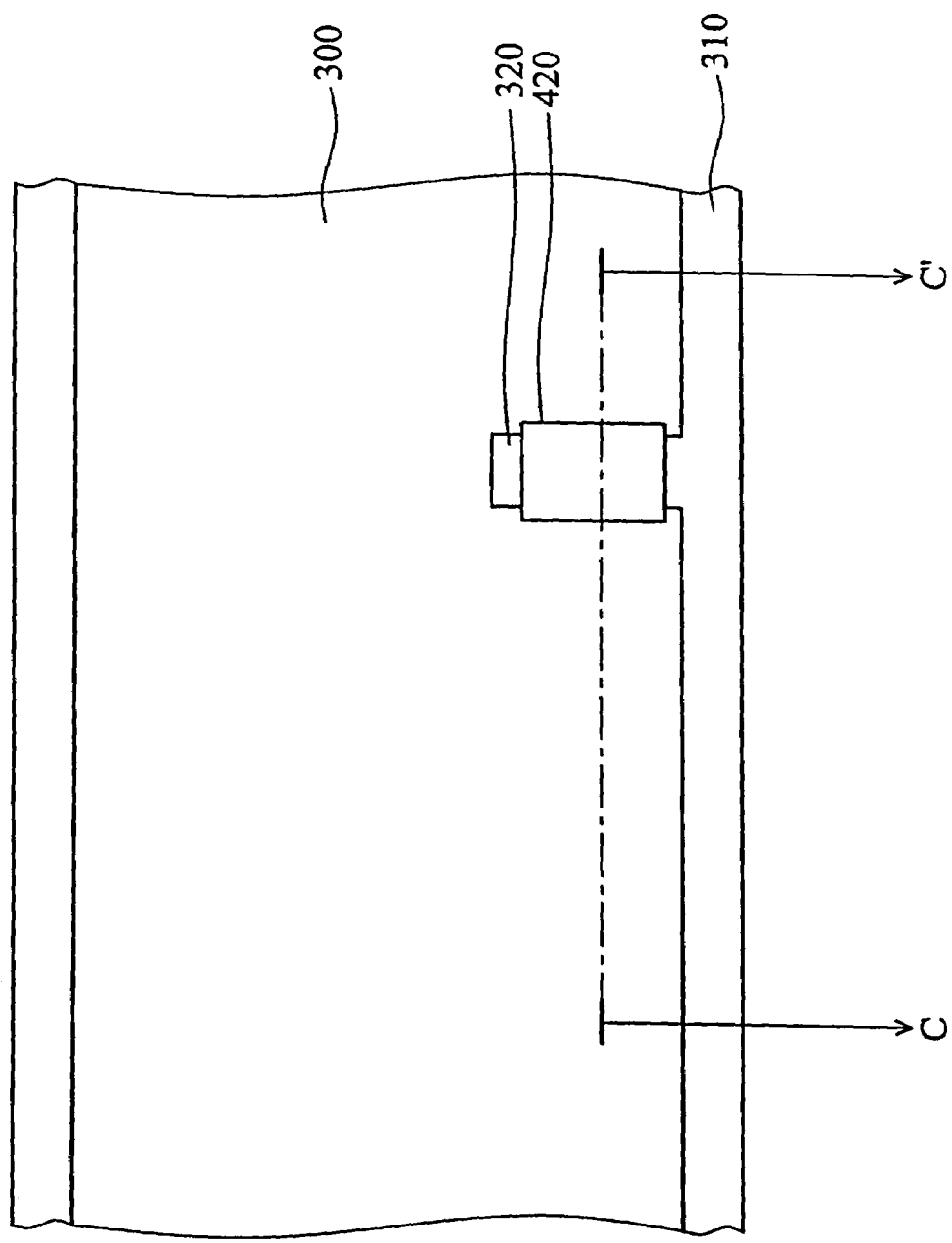

In FIGS. 4A and 4B, an amorphous silicon layer (a-Si layer, not shown) is deposited on the gate insulation layer 330, and then a doped amorphous silicon layer (e.g. $n^+$ α-Si, not shown) is deposited on the amorphous silicon layer. Next, a second photolithography (PEP II) is performed, and part of the doped amorphous silicon layer and the amorphous silicon layer are etched to form a semiconducting island on the gate insulation layer 330 in the transistor area 302. The semiconducting island is composed of a patterned amorphous silicon layer 410 and a patterned doped amorphous silicon layer 420.

Figure 5A:
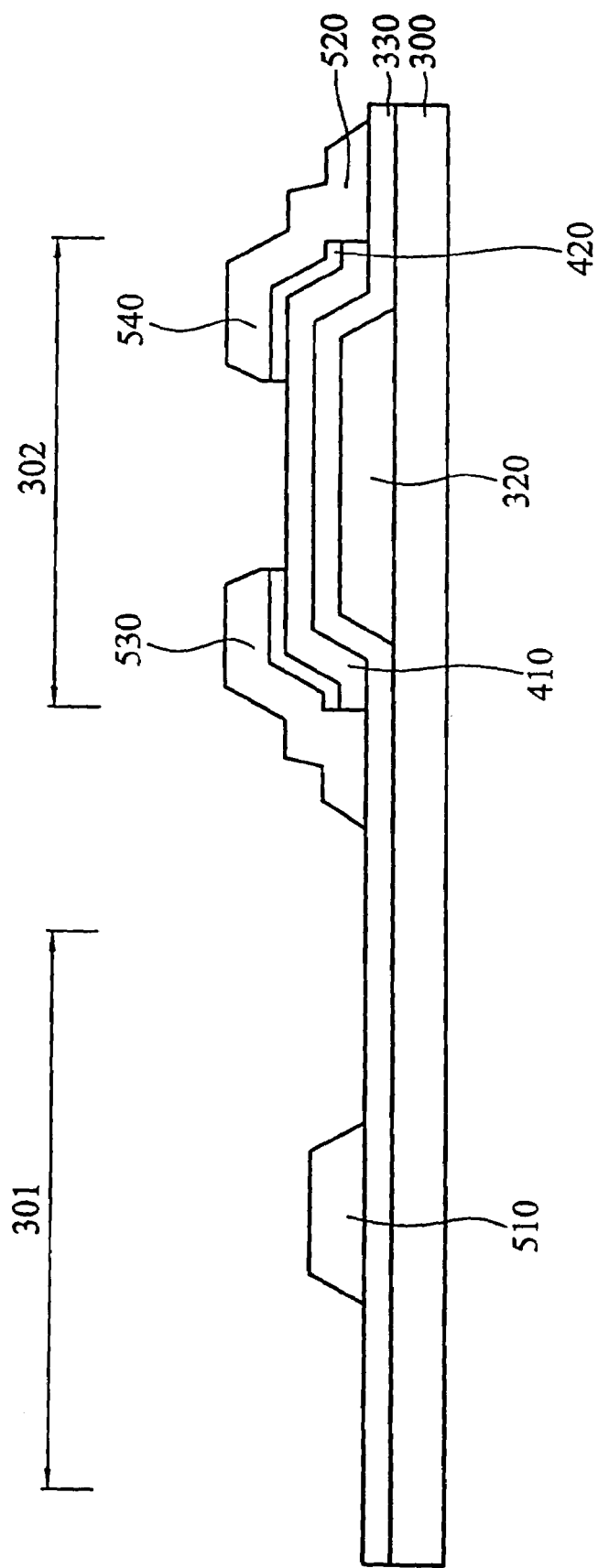
Figure 5B:
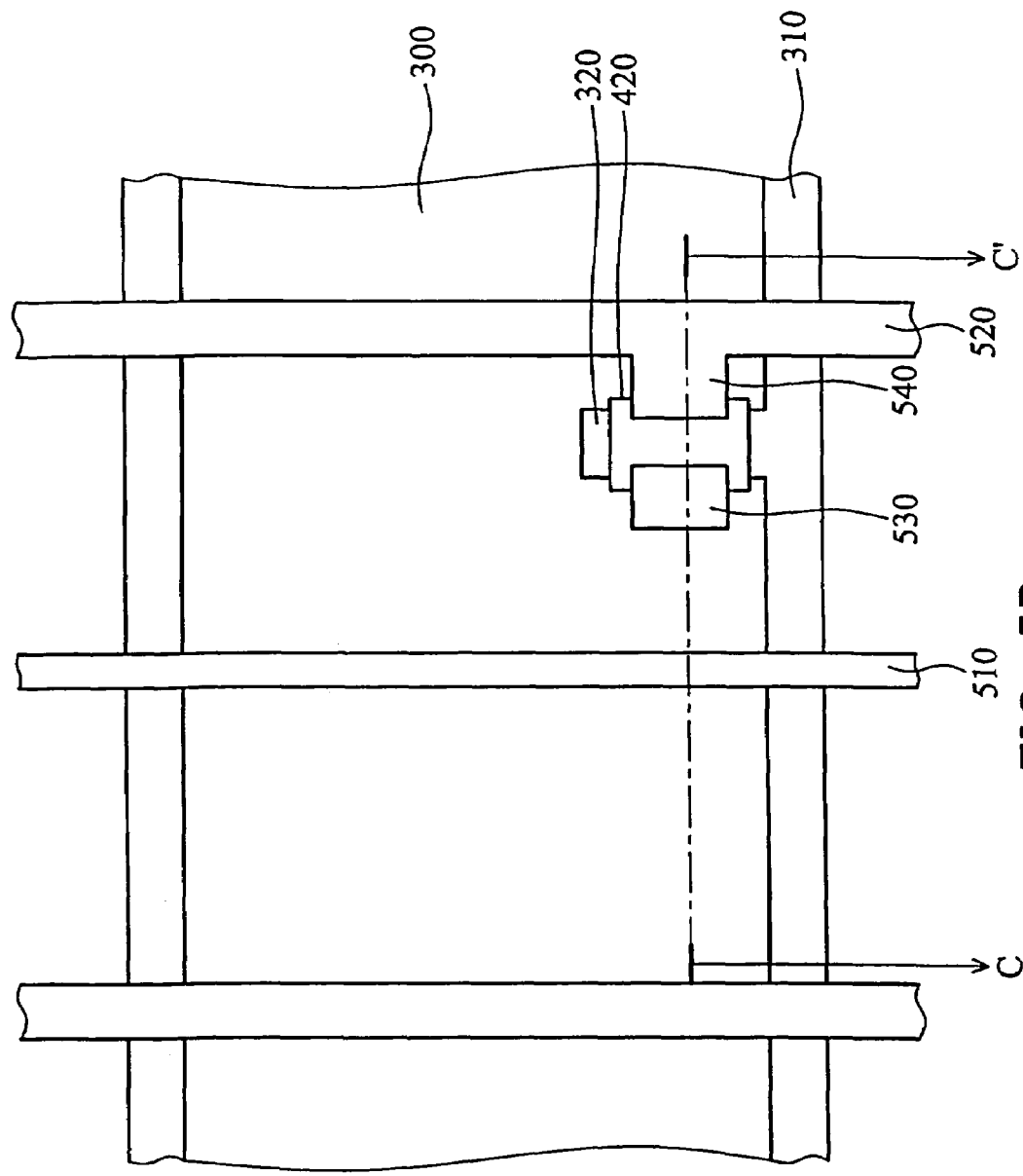

In FIGS. 5A and 5B, a conductive layer (not shown) is deposited on the gate insulation layer 330 and the semiconducting island. The, a third photolithography (PEP III) is performed to remove part of the conductive layer (not shown), and a longitudinally extending common line 510 and a longitudinally extending data line 520 are formed on the gate insulation layer 330, and simultaneously, a source electrode 530 and a drain electrode 540 are formed on the doped amorphous silicon layer 420. Then, using the source electrode 530 and the drain electrode 540 as a mask, part of the doped amorphous silicon layer 420 is etched to expose part of the surface of the amorphous silicon layer 410. Thus, a thin film transistor (TFT) structure is obtained in the transistor area 302. Also, the drain electrode 540 electrically connects the data line 520.

Figure 6A:
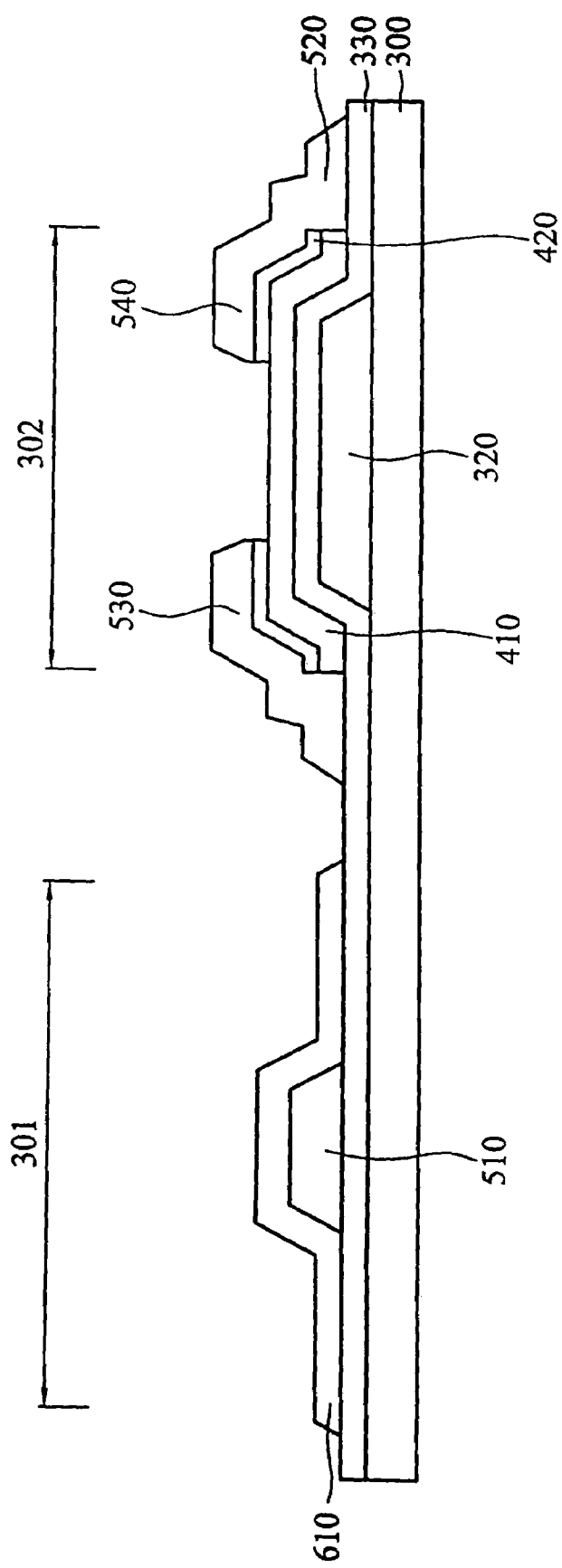
Figure 6B:
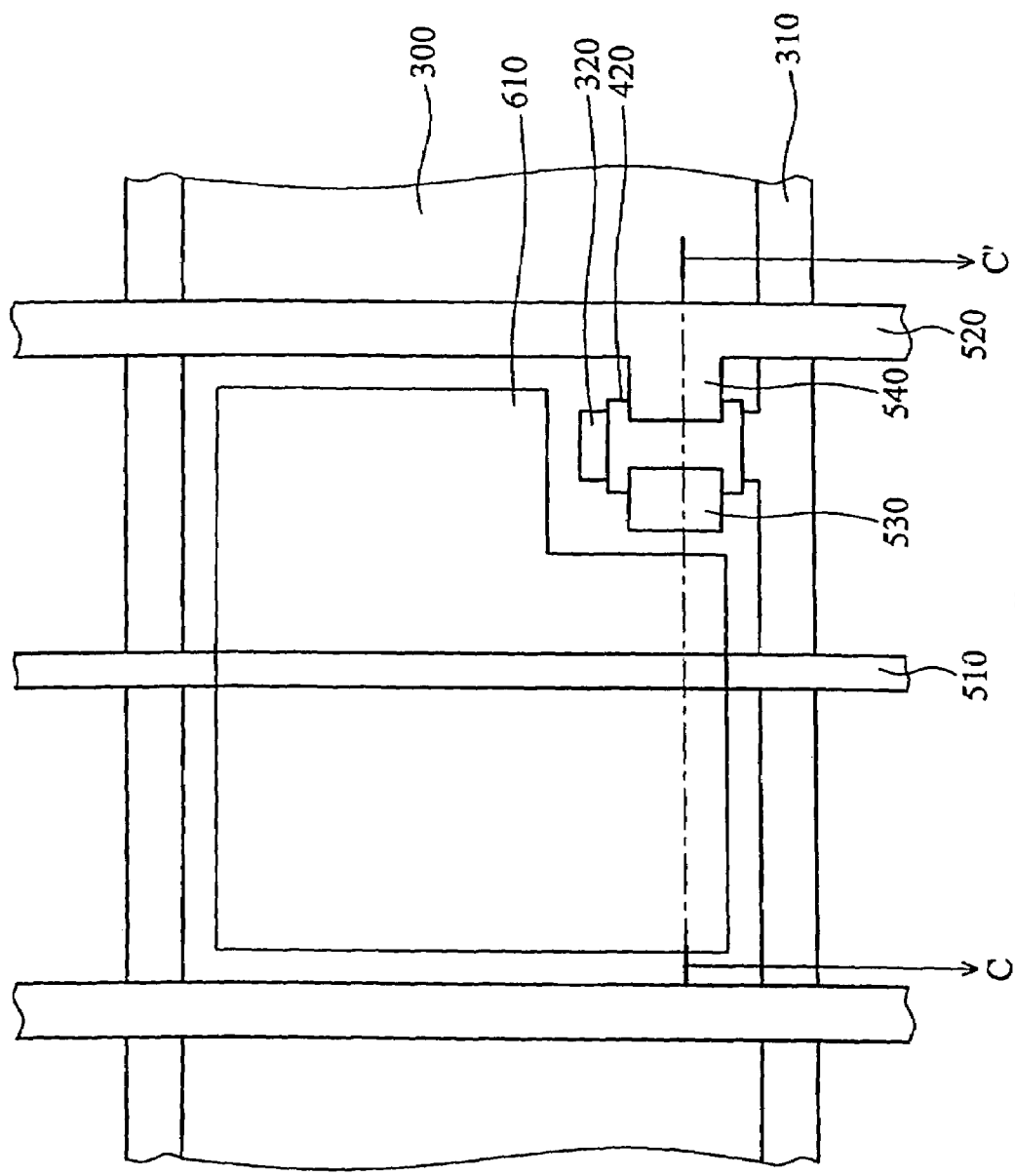

In FIGS. 6A and 6B, deposition and a fourth photolithography (PEP IV) are performed, and a first conductive layer 610 is formed on the gate insulation layer 330 in the capacitor area 301 and coverts the common line 510. The first conductive layer 610 may be indium tin oxide (ITO) or indium zinc oxide (IZO) formed by deposition, serving as a bottom electrode or a pixel electrode.

Figure 7A:
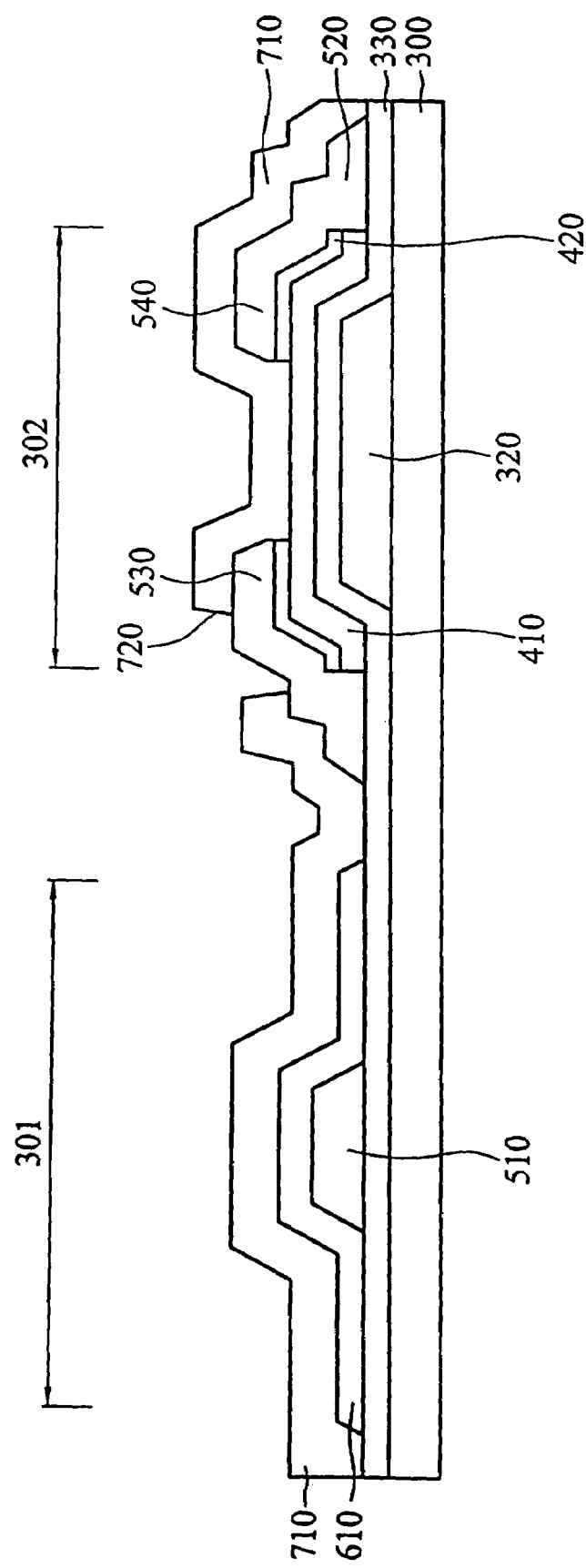
Figure 7B:
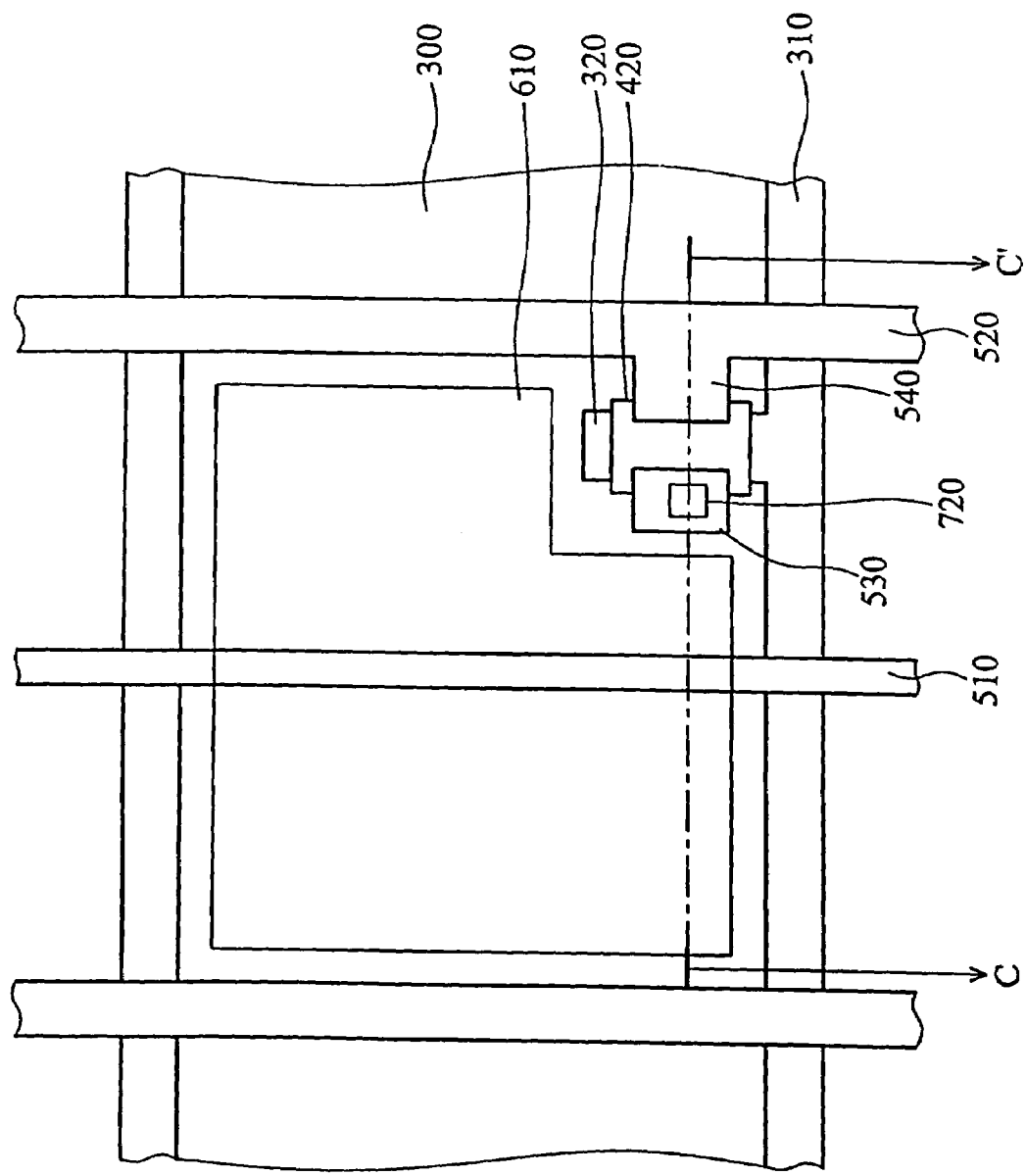

In FIGS. 7A and 7B, a conformal passivation layer 710 is formed on the gate insulation layer 330, the first conductive layer 610, the TFT structure, the data line 520 and the gate line 310. Then, a fifth photolithography (PEP V) is performed, and a first via hole 720 penetrating the passivation layer 710 is formed to expose the surface of the source electrode 530. The passivation layer 710 is dielectric, such as $SiN_x$, serving as a dielectric layer of a capacitor.

Figure 8A:
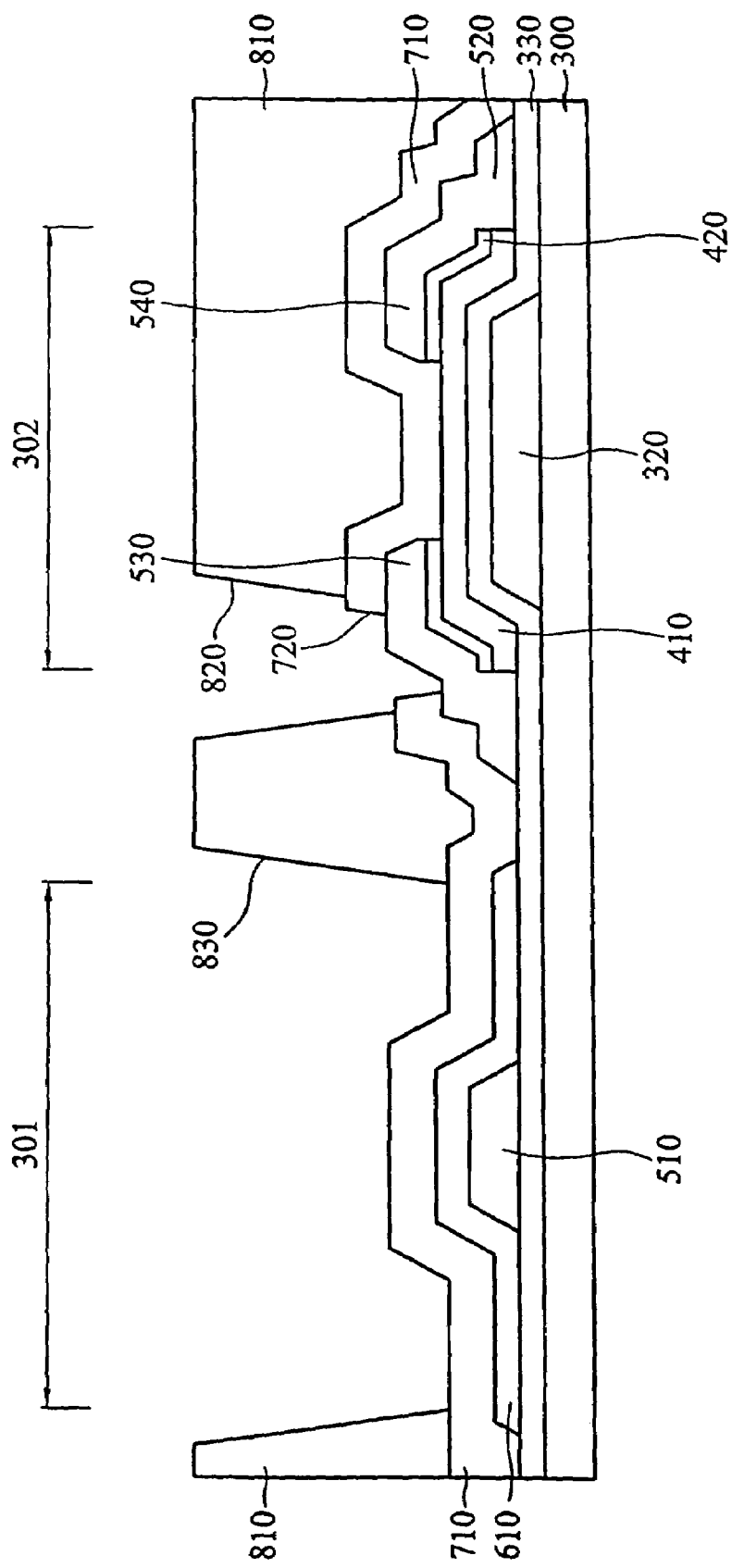
Figure 8B:
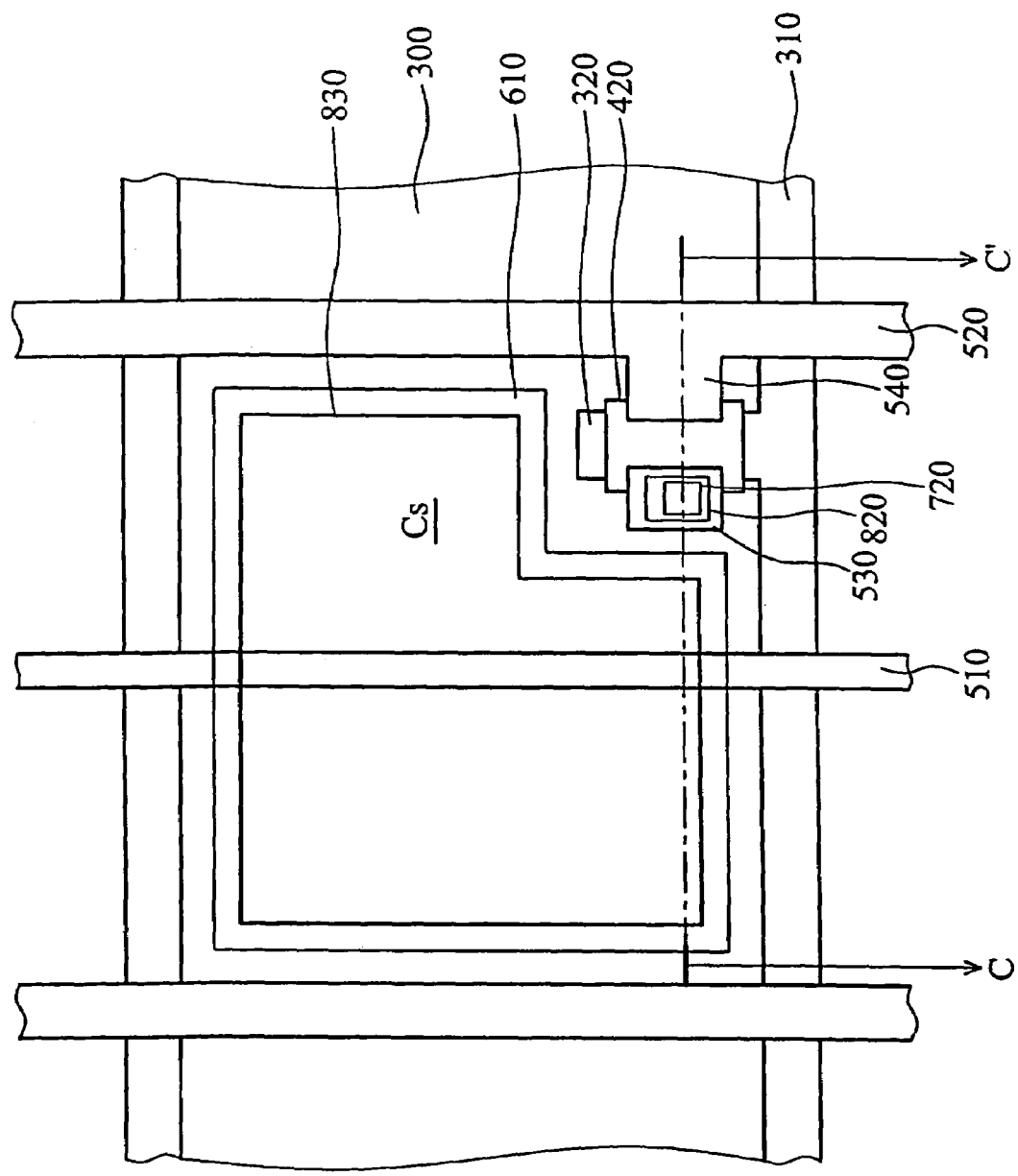

In FIGS. 8A and 8B, a planarization layer 810 is formed on the passivation layer 710 and fills the first via hole 720. Then, a sixth photolithography (PEP VI) is performed, and a second via hole 820 and a third via hole 830 penetrating the planarization layer 810 are formed. The second via hole 820 exposes at least the surface of the source electrode 530. The third via hole 830 exposes the surface of the passivation layer 710 in the capacitor area 301. The planarization layer 810 may be a spin-on-glass (SOG) layer or organic layer (e.g. photoresist) formed by spin coating.

Figure 9A:
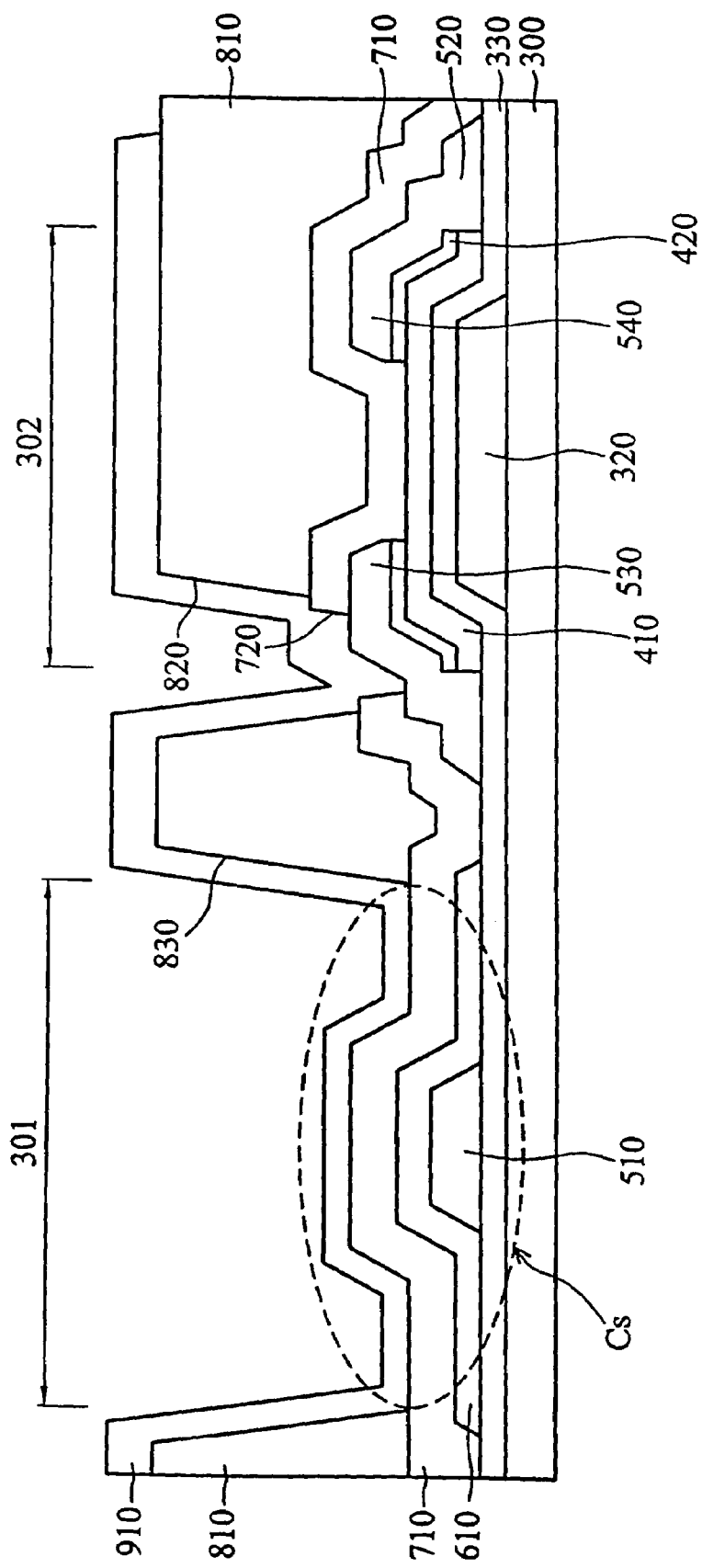
Figure 9B:
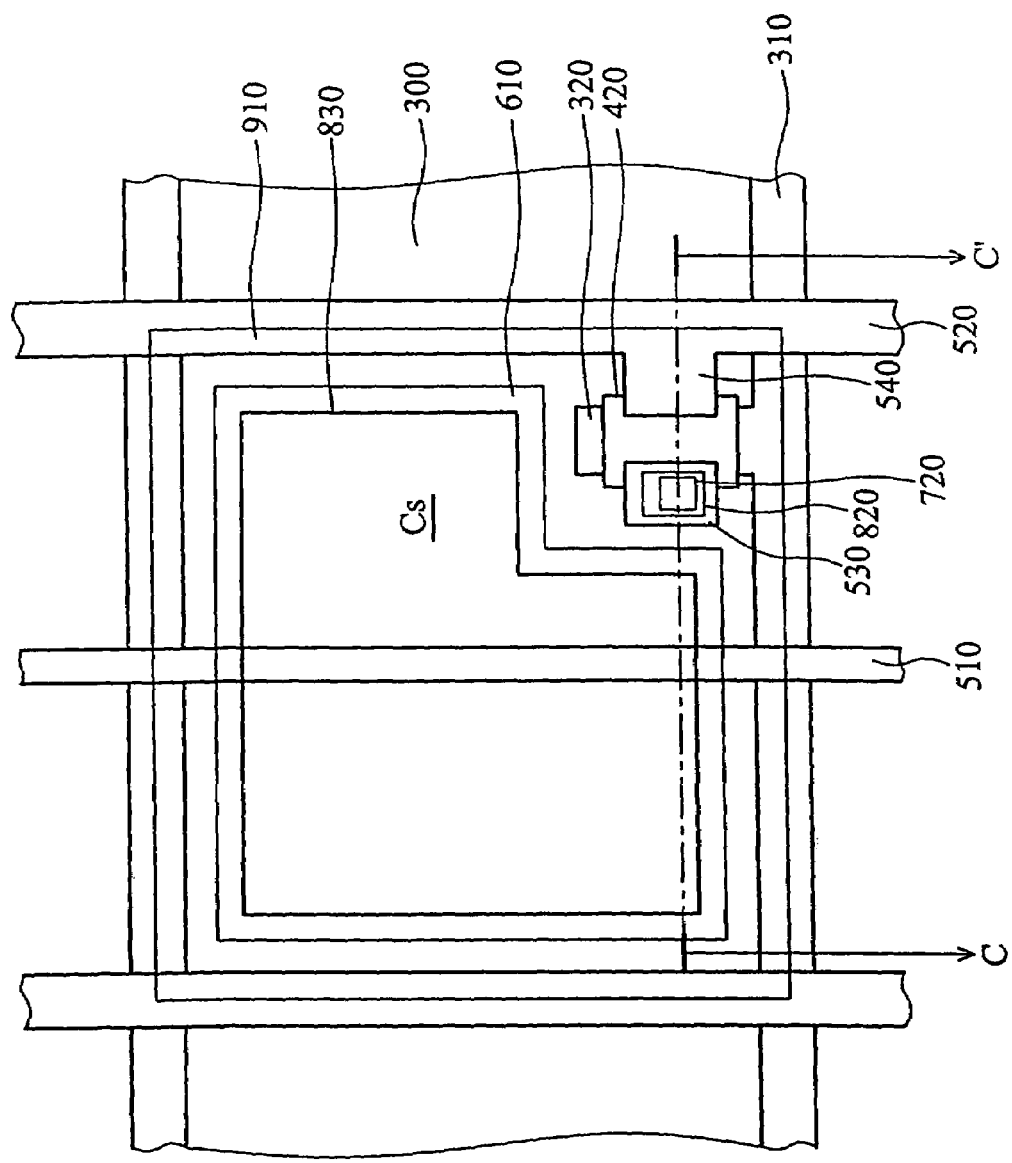
Figure 9C:
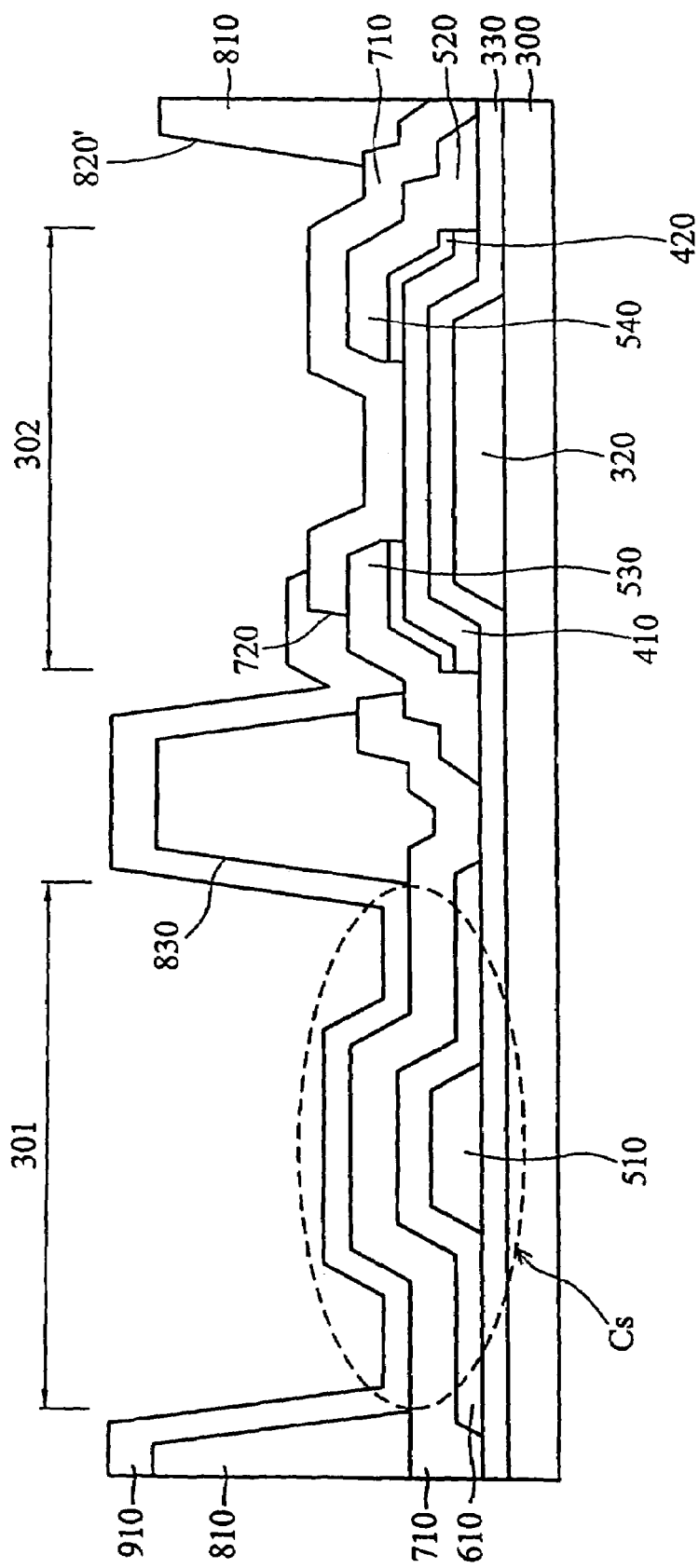
FIG. 9C is a sectional view, according to a modification of the exemplary embodiment of the present invention, taken along line D-D' of FIG. 9D.
Figure 9D:
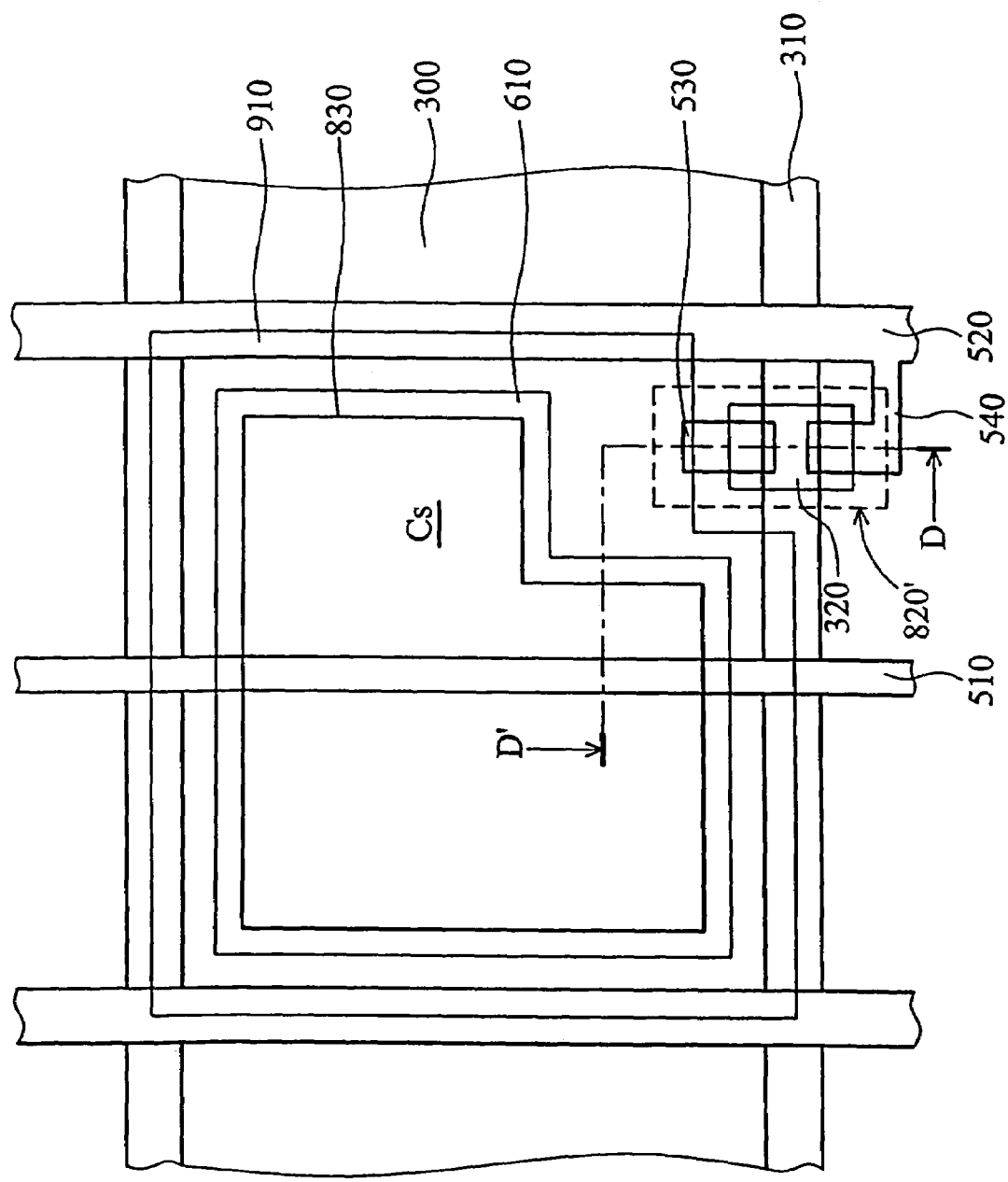
FIG. 9D is a perspective top view according to the modification of the exemplary embodiment of the present invention.

In FIGS. 9A and 9B, deposition and a seventh photolithography (PEP VII) are performed, and a conformal second conductive layer 9110 is formed on part of the planarization layer 810, electrically connecting the source electrode 530. The second conductive layer 910 may be indium tin oxide (ITO) or indium zinc oxide (IZO) formed by deposition, serving as a top electrode or a charge collector electrode. Thus, a storage capacitor structure Cs composed of the first conductive layer 610, the passivation layer 710 and the second conductive layer 910 in the capacitor area 301 is obtained.

FIG. 9C is a sectional view, according to a modification of the exemplary embodiment of the present invention, taken along line D-D' of FIG. 9D. FIG. D is a top view according to the modification of the first embodiment of the present invention. Elements in FIGS. 9C and 9D repeated from FIGS. 9A and 9B use the same reference numbers. Additionally, because the materials of the parts in the modification are the same as the above, the description of the material is omitted for purposes of brevity.

In FIGS. 9C and 9D, a substrate 300 having a capacitor area 301 and a transistor area 302 is provided. Then, a transversely extending gate line 310 is formed on the substrate 300. The gate line 310 includes a gate electrode 320 in the transistor area 302.

Next, a gate insulation layer 330 is formed on the gate line 310, the gate electrode 320 and the substrate 300. Then, an amorphous silicon layer 410 and a doped amorphous silicon layer 420 are formed on part of the gate insulation layer 330. Thus, a semiconducting island composed of the amorphous silicon layer 410 and the doped amorphous silicon layer 420 is obtained.

Next, a longitudinally extending common line 510 and a longitudinally extending data line 520 are formed on the gate insulation layer 330, and simultaneously, a source electrode 530 and a drain electrode 540 are formed on the doped amorphous silicon layer 420. Then, using the source electrode 530 and the drain electrode 540 as a mask, part of the doped amorphous silicon layer 420 is etched to expose part of the surface of the amorphous silicon layer 410. Thus, a thin film transistor (TFT) lying on the gate line 310 is obtained. Also, the drain electrode 540 electrically connects the data line 520. Next, a first conductive layer 610 is formed on the gate insulation layer 330 in the capacitor area 301 and covers the common line 510. The first conductive layer 610 serves as a bottom electrode or a pixel electrode.

Next, a conformal passivation layer 710 is formed on the gate insulation layer 330, the first conductive layer 610, the TFT structure, the data line X520 and the gate line 310. Then, by photolithography, a first via hole 720 penetrating the passivation layer 710 is formed to expose the surface of the source electrode 530.

Next, a planarization layer 810 is formed on the passivation layer 710 and fills the first via hole 720. Then, by photolithography, a second via hole 820' and a third via hole 830 are formed. The second via hole 820' exposes the surface of the source electrode 530 and the surface of the passivation layer 710 in the transistor area 302. The third via hole 830 exposes the surface of the passivation layer 710 by penetrating the planarization layer 810 in the capacitor area 301.

Next, a conformal second conductive layer 910 is formed on part of the planarization layer 810 and electrically connects the source electrode 530. The second conductive layer 910 serves as a top electrode or a charge collector electrode. Thus, a storage capacitor structure Cs composed of the first-conductive layer 610, the passivation layer 710 and the second conductive layer 910 in the capacitor area 301 is obtained.

FIGS. 10A-16A are sectional views of an X-ray detector array element, according to a further exemplary embodiment of the present invention, taken along line C-C' of FIGS. 10B-16B. FIGS. 10B-16B are top views of an X-ray detector array element according to the second embodiment of the present invention. In order to simplify the illustration, the accompanying drawings show a single pixel region of a substrate. Of course, the number of pixel regions is very large for a typical array.

Figure 10A:
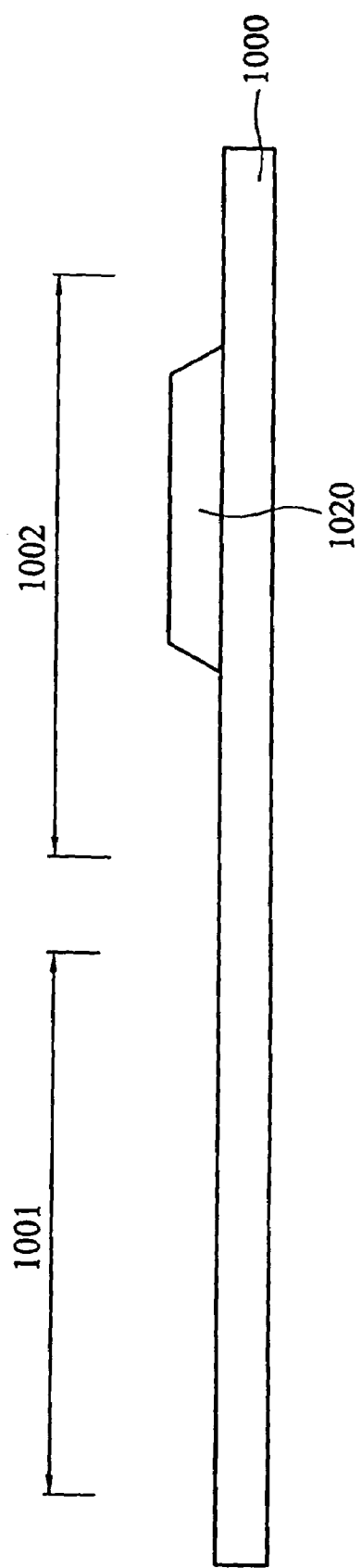
Figure 10B:
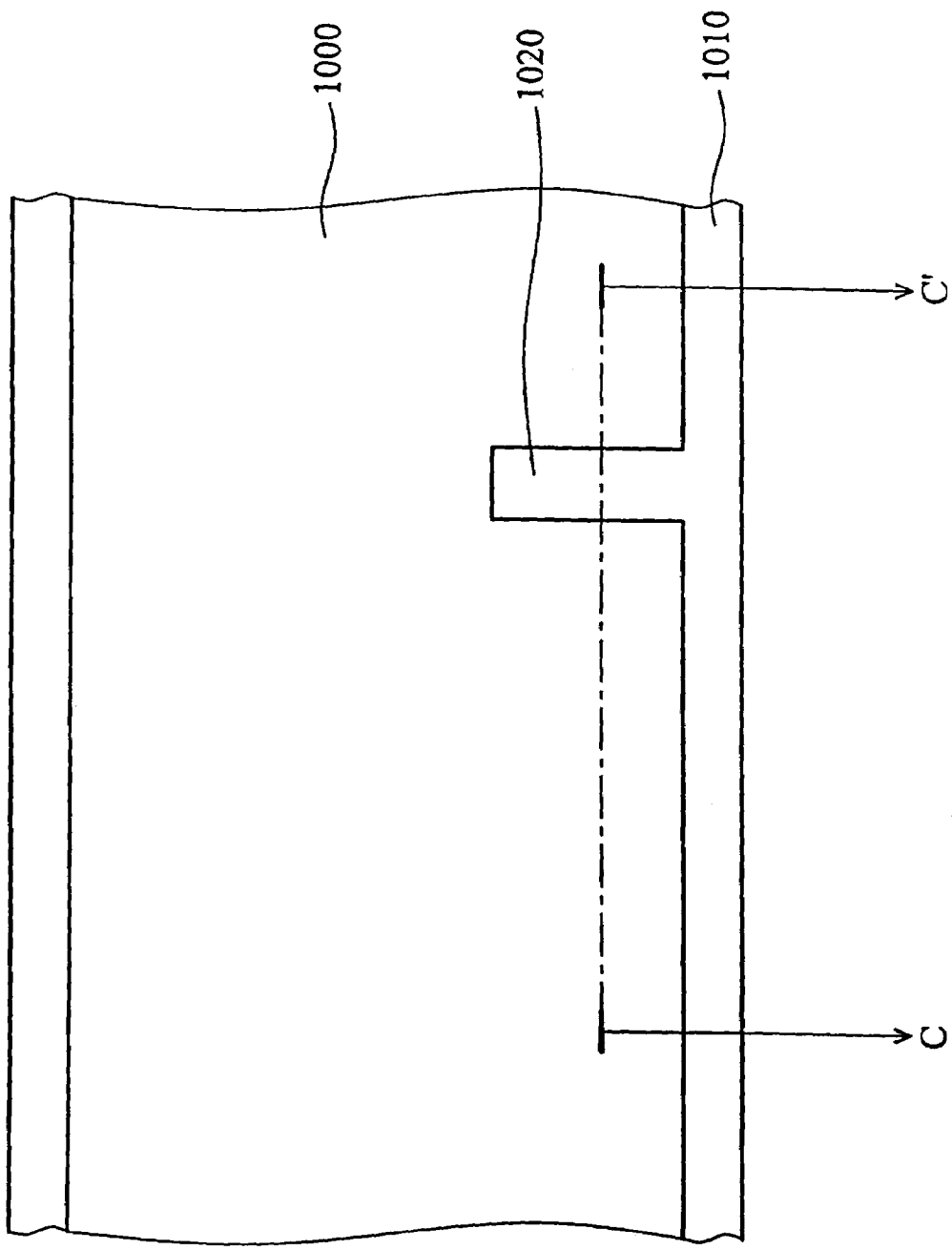

In FIGS. 10A and 10B, all, substrate 1000, such as a glass substrate, having a capacitor) area 1001 and a transistor area 1002 is provided. They, deposition and a first photolithography (also called a first photo engraving process, PEP I) are performed, and a transversely extending gate line 1010 is formed on the substrate 1000. The gate line 1010 includes a gate electrode 1020 in the transistor area 1002.

It should be noted that FIG. 10B shows the gate line 1010 having a protruding portion 1020 in the transistor area 1002, serving as the gate electrode 1020. Nevertheless, the invention is not intended to limit the position of the gate electrode. For example, the gate line 1010 located in the transistor area 1002 can serve as the gate electrode 1020, whose illustration is similar to the modification of the first described exemplary embodiment and thus is not described again here.

Figure 11A:
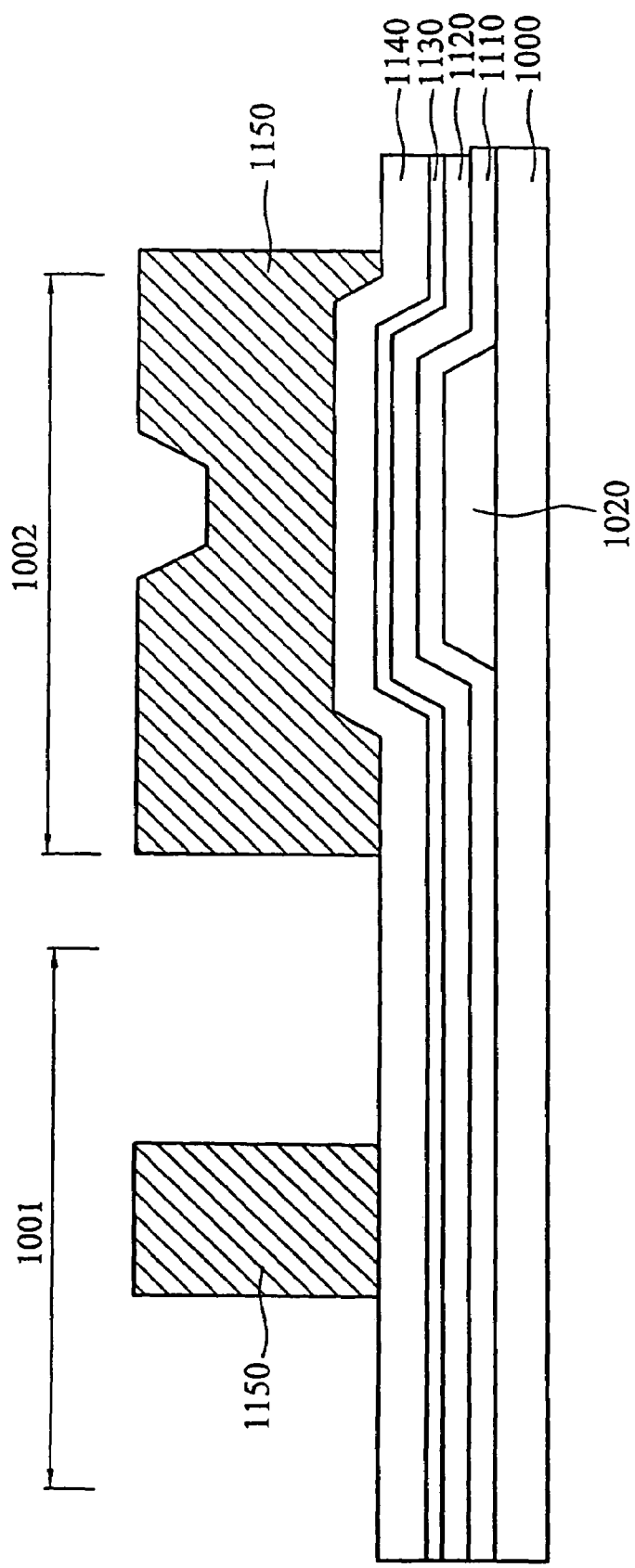
Figure 11B:
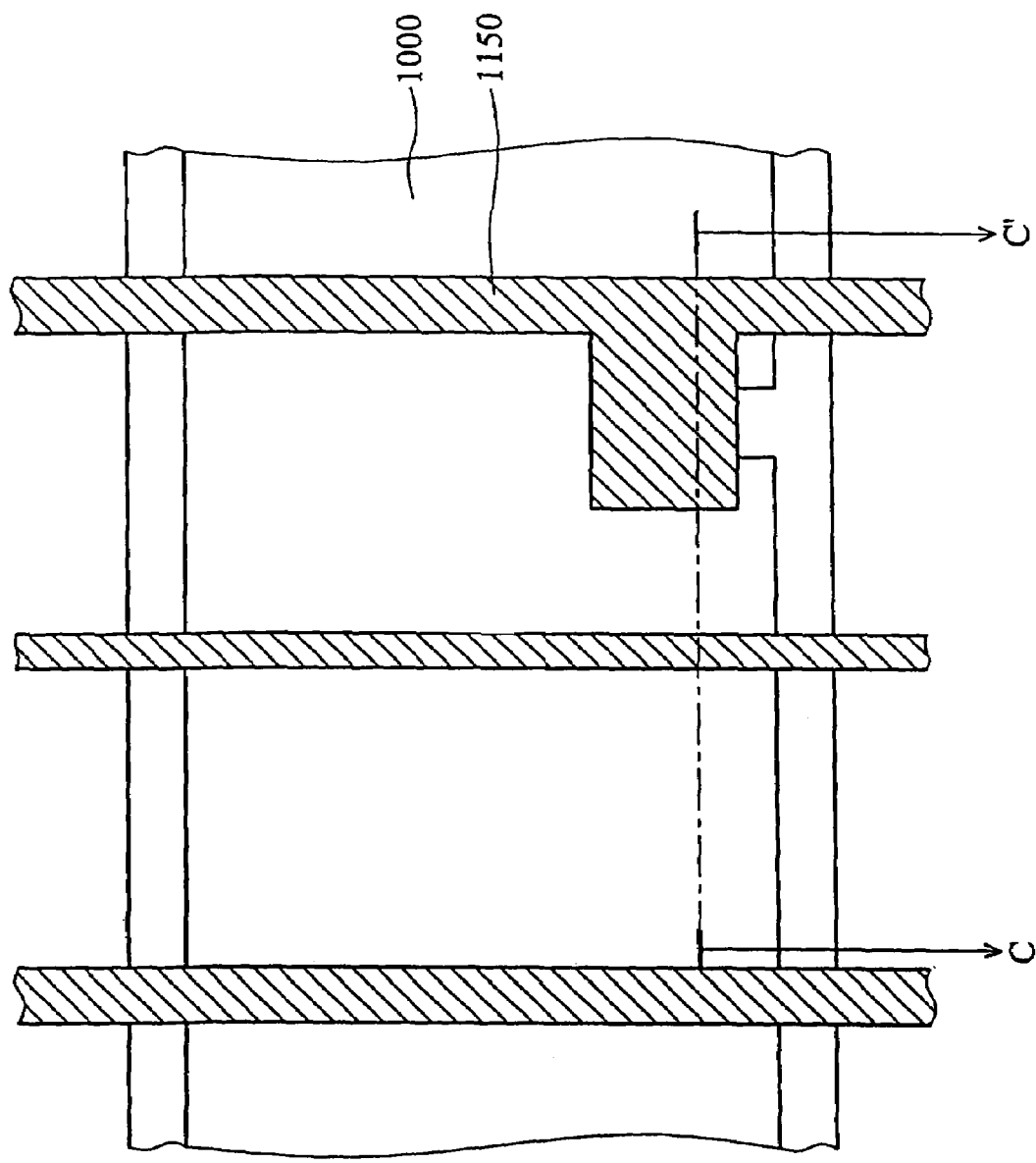

In FIGS. 11A and 11B, a gate insulation layer 1110 is formed on the gate line 1010, the gate electrode 1020 and the substrate 1000. The gate line 1010 and the gate electrode 1020 may be metal formed by deposition. The gate insulation layer 1110 may be $SiO_2$, $SiN_x$, or SiON formed by deposition. Then, an amorphous silicon layer (α-Si layer) 1120 and a doped amorphous silicon layer (e.g. $n^+$ α-Si layer) 1130 are in turn deposited on the gate insulation layer 1110. Then, a first conductive layer 1140 is formed on the doped amorphous silicon layer 1130. The first conductive layer 1140 may be a metal layer formed by deposition. Then, by deposition and a second photolithography (PEP II), a grey-tone photoresist pattern (also called a slit photoresist pattern) 1150 is formed on the first conductive layer 1140.

Figure 12A:
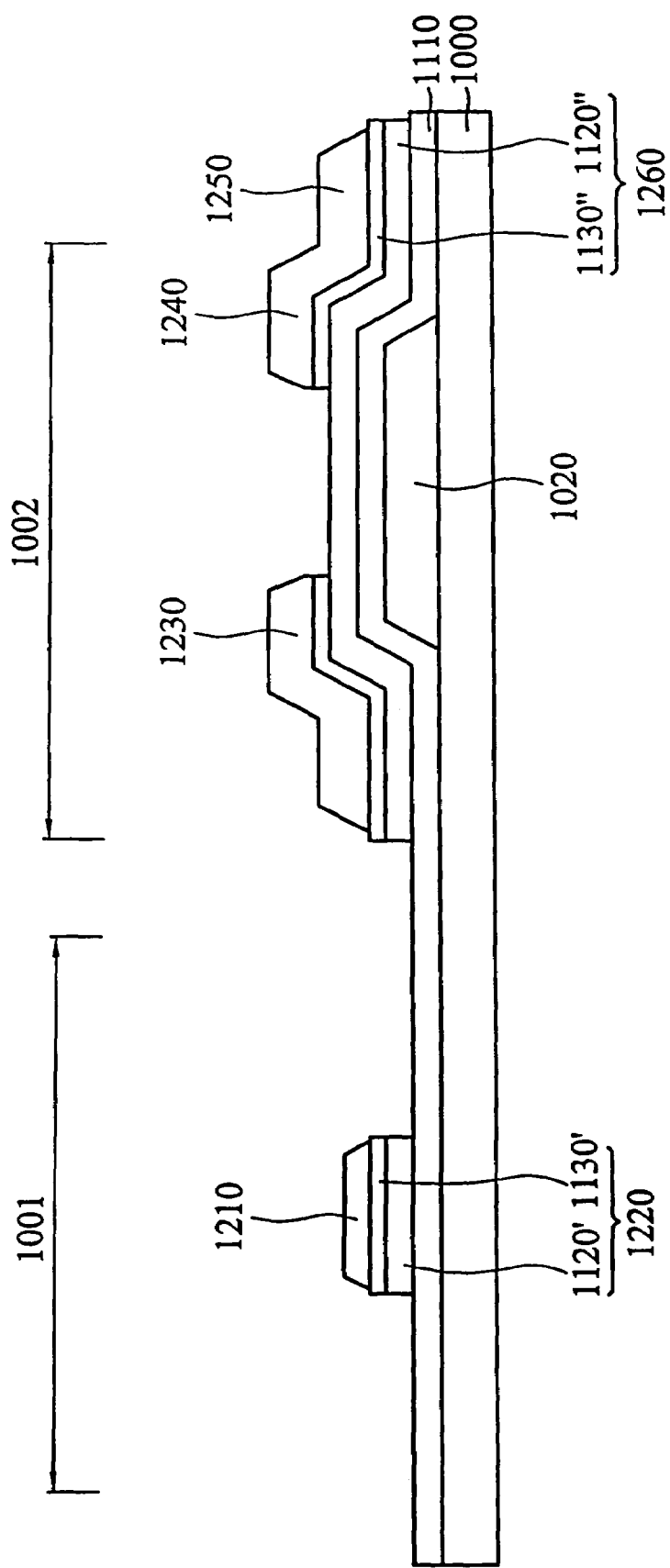
Figure 12B:
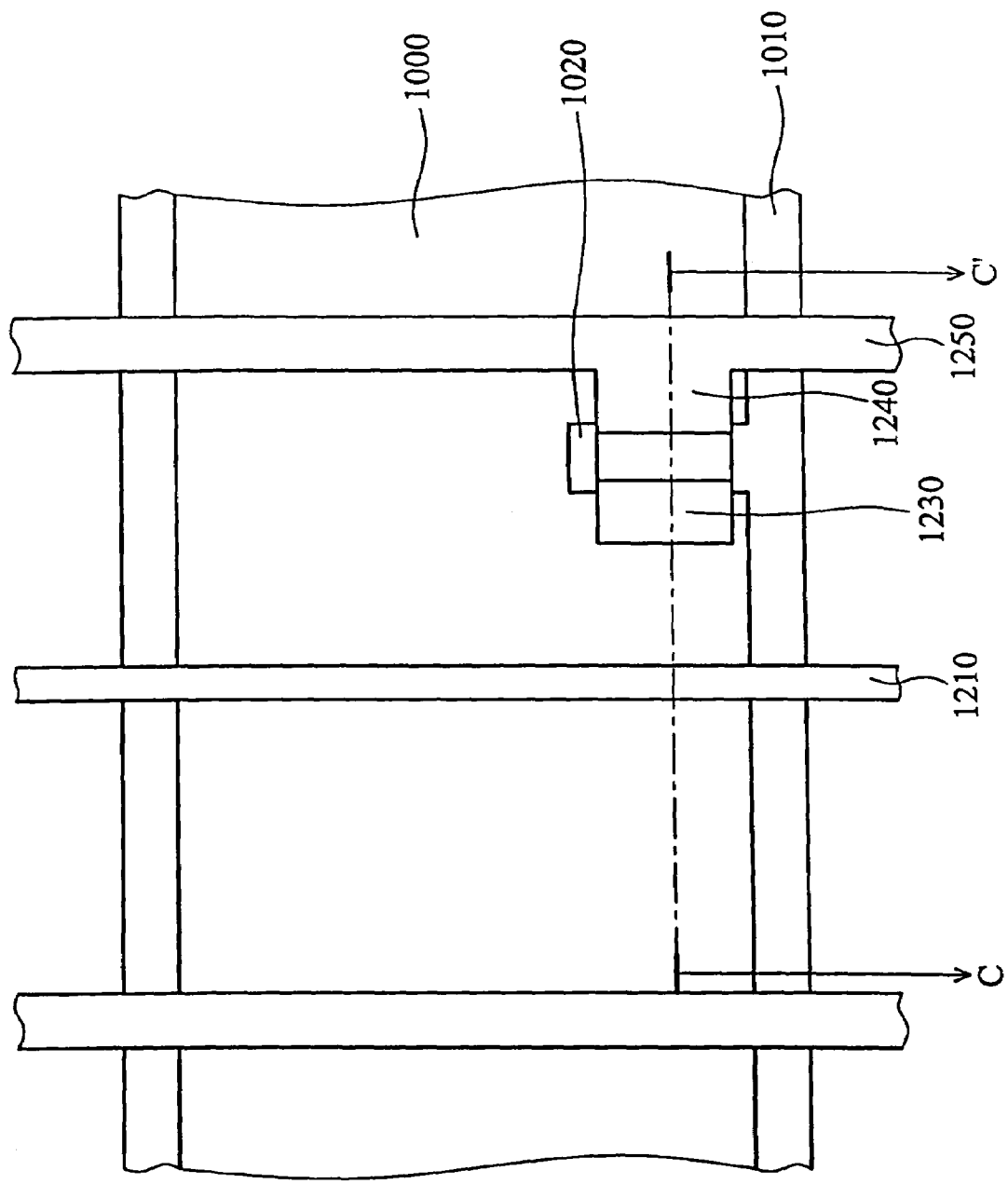

In FIGS. 12A and 12B, using a gray-toned photoresist pattern 1150 as a mask and performing etching, part of the first conductive layer 1140, the doped amorphous silicon layer 1130 and the amorphous silicon layer 1120 are etched to form a longitudinally extending common line 1210 on a first semiconducting island 1220 composed of a remaining amorphous silicon layer 1120' and a remaining doped amorphous silicon layer 1130', and simultaneously, to form a source electrode 1230, a drain electrode 1240 and a longitudinally extending data line 1250'' on a second semiconducting island 1260 composed of a remaining amorphous silicon, layer 1120 and a remaining doped amorphous silicon layer 1130''. Thus, a thin film transistor (TFT) structure is obtained. Also, the drain electrode 1240 electrically connects the data line 1250.

Figure 13A:
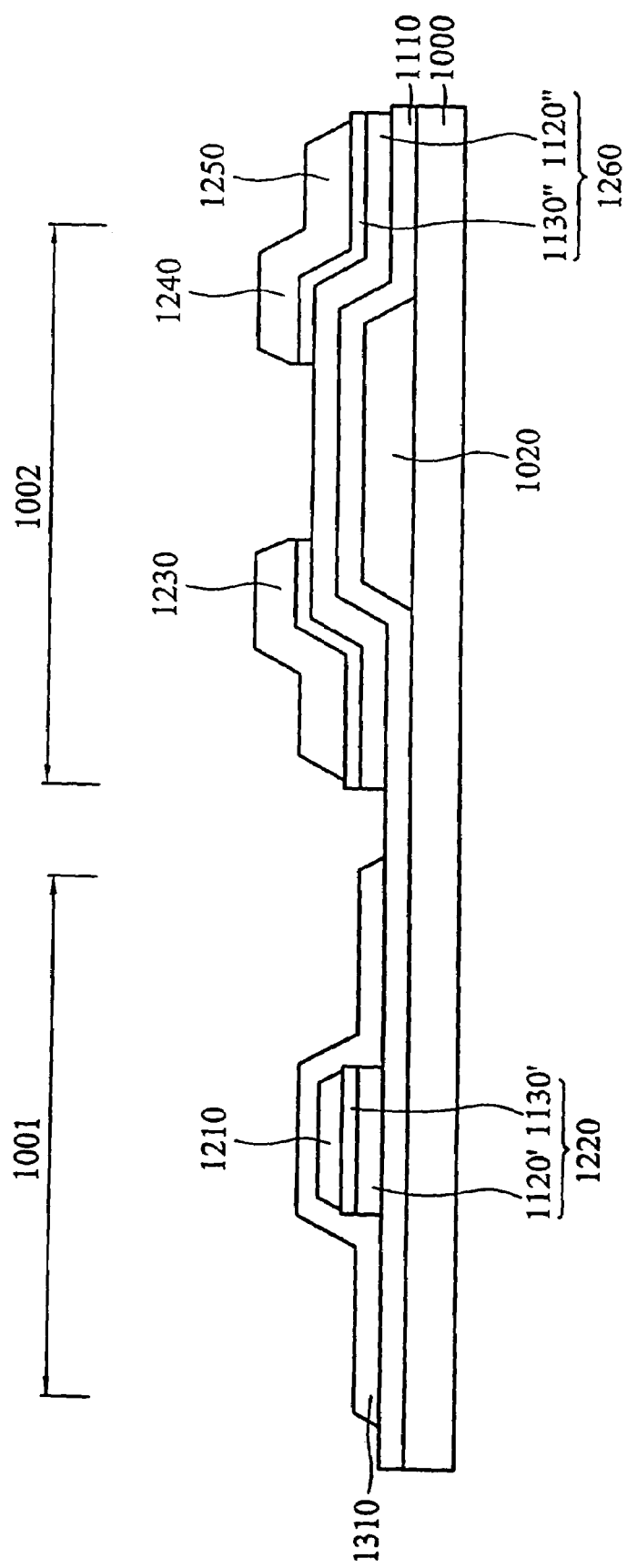
Figure 13B:
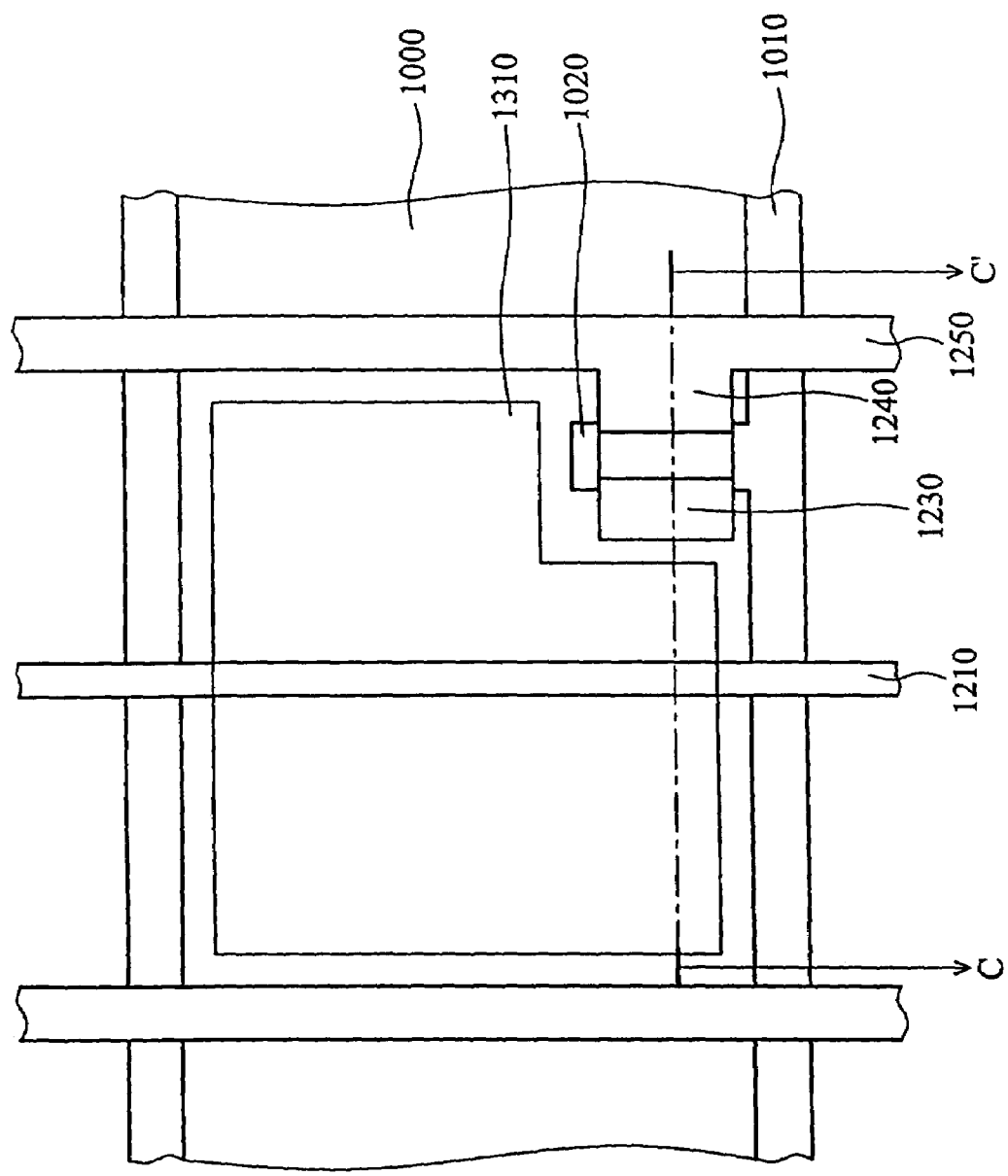

In FIGS. 13A and 13B, by deposition and a third photolithography (PEP III), a second conductive layer 1310 is formed on the gate insulation layer 1110 in the capacitor area 1001, covering the common line 1210. The second conductive layer 1310 may be indium tin, oxide (ITO) or indium zinc oxide (IZO) formed by deposition, serving as a bottom electrode or a pixel electrode.

Figure 14A:
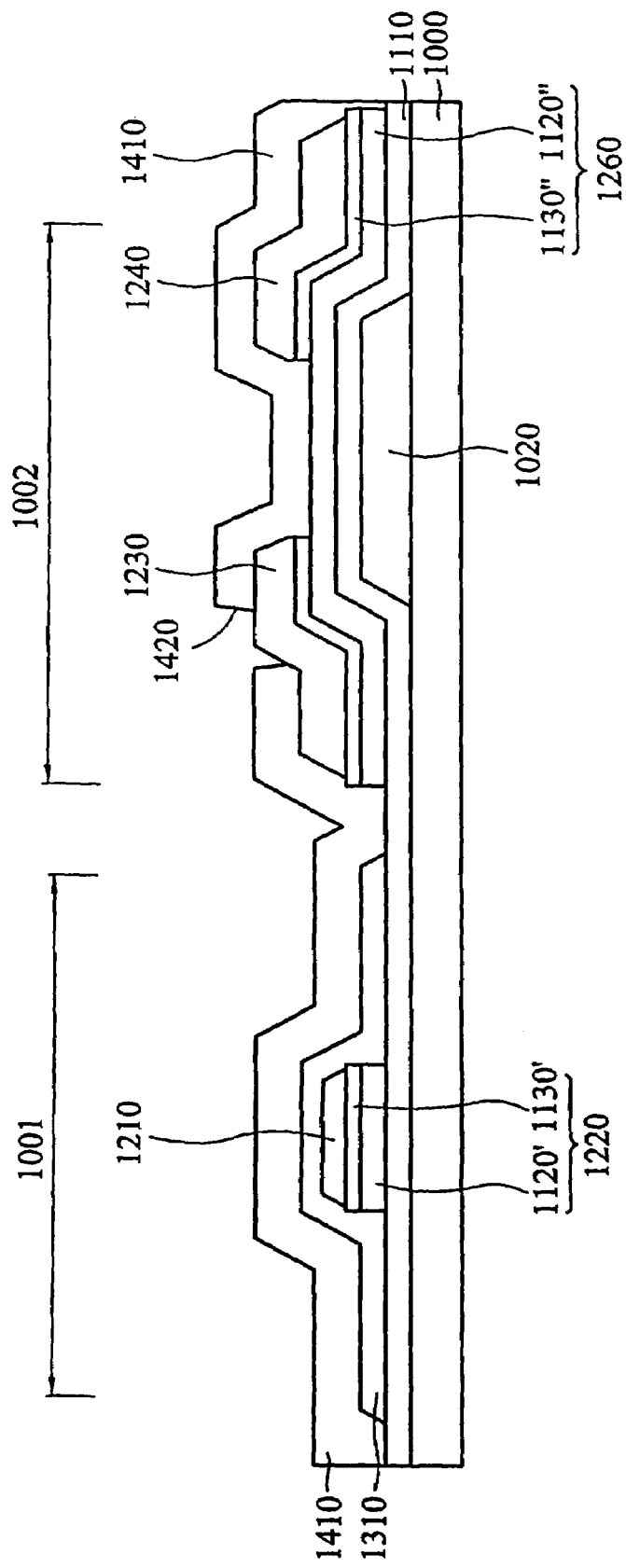
Figure 14B:
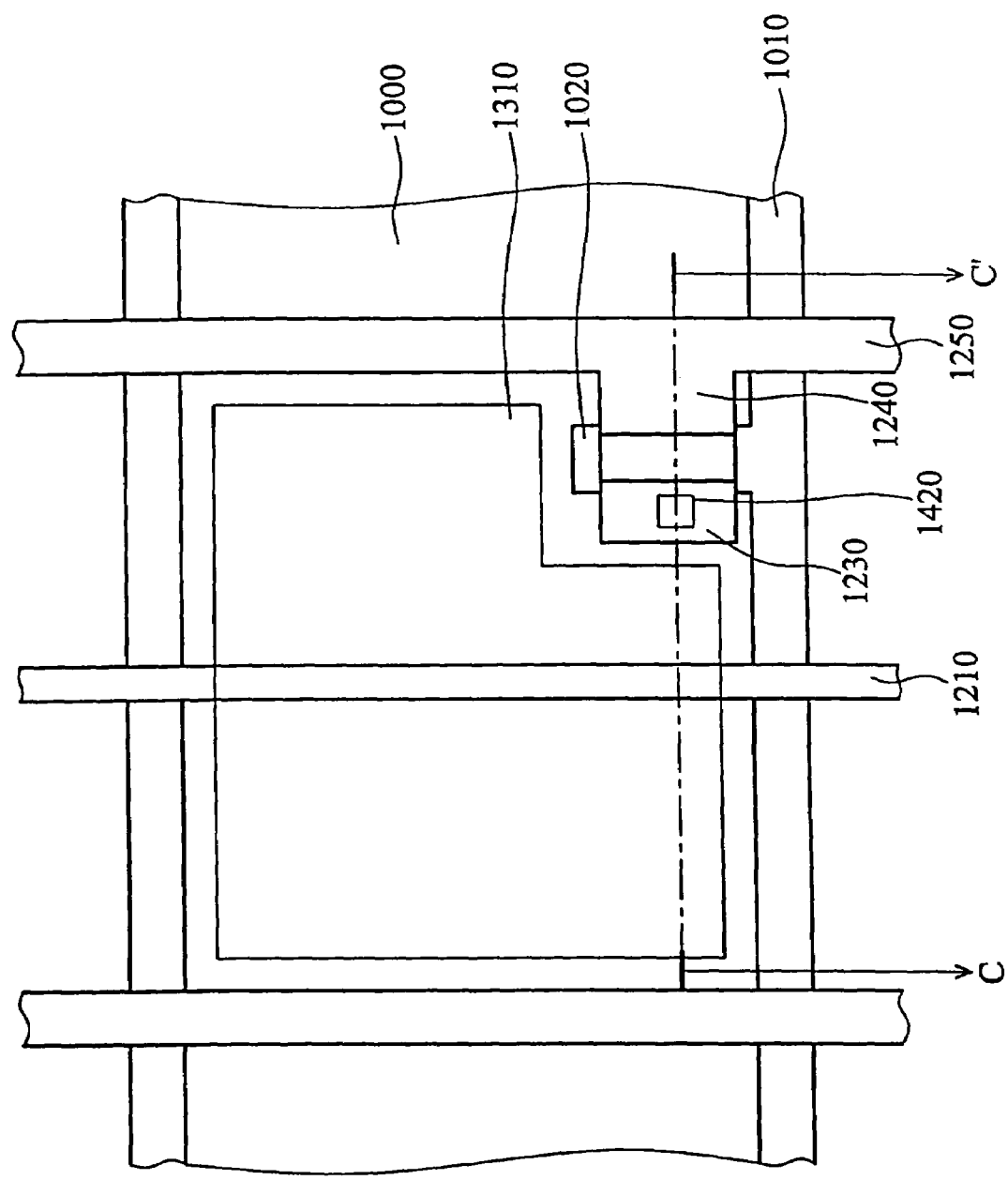

In FIGS. 14A and 14B, a conformal passivation layer 1410 is formed on the gate insulation layer 1110, the first conductive layer 1310, the TAT structure, the data line 1250 and the gate line 1010. Then, by a fourth photolithography (PEP IV), a first via hole 1420 penetrating the passivation layer 1410 is formed to expose the surface of the source electrode 1230. The passivation layer 1410 is dielectric, such as SiN$_x$, serving as a dielectric layer of a capacitor.

Figure 15A:
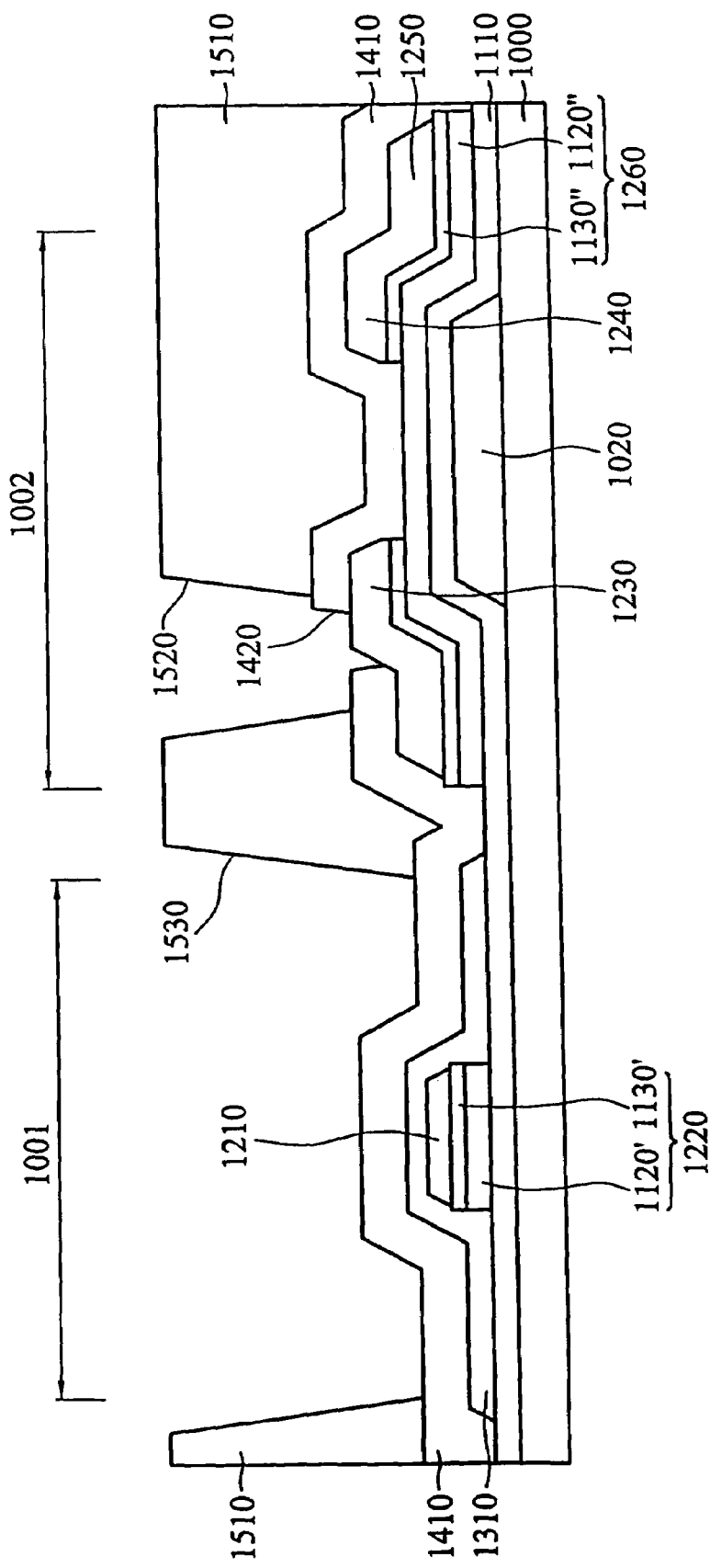
Figure 15B:
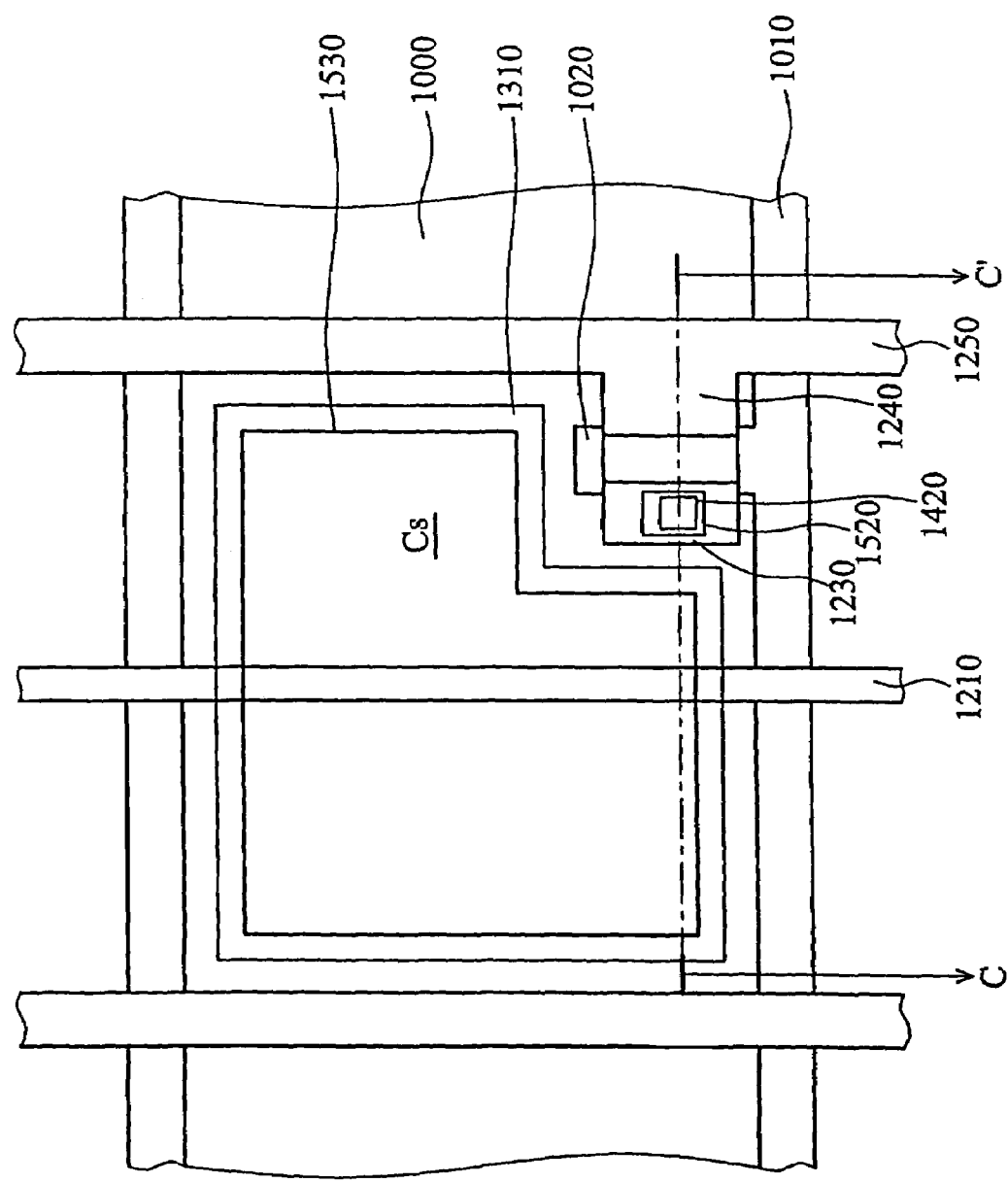

In FIGS. 15A and 15B, a planarization layer 1510 is formed on the passivation layer 1410 land fills the first via hole 1420. Then, by a fifth photolithography (PEP V), a second via hole 1520 and a third via hole 1530 penetrating the planarization layer 1510 are formed. The second via hole 1520 exposes at least the surface of the source electrode 1230. The third via hole 1530 exposes the surface of the passivation layer 1410 in the capacitor area 1001. The planarization layer 1510 may be a spin-on-glass (SOG) layer or organic layer (e.g. photoresist) formed by spin coating.

Figure 16A:
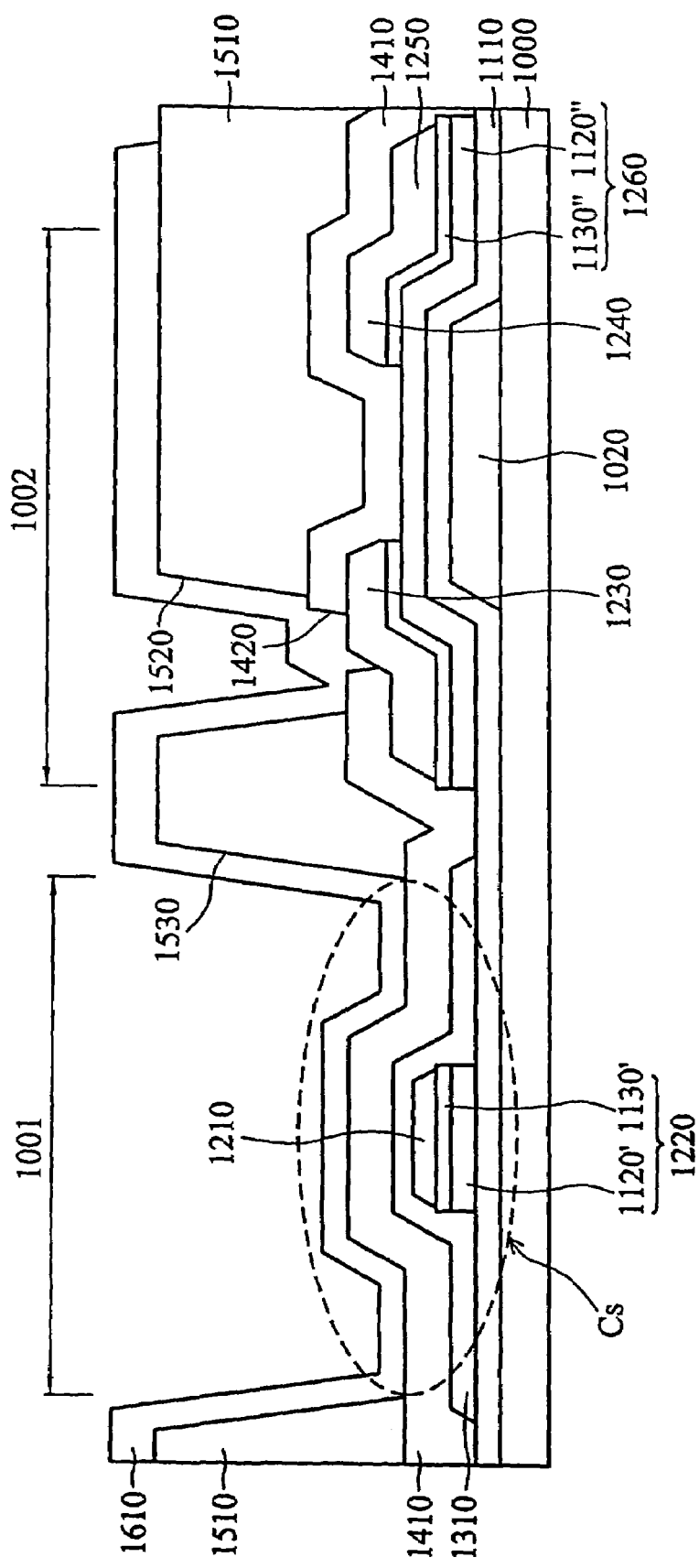
Figure 16B:
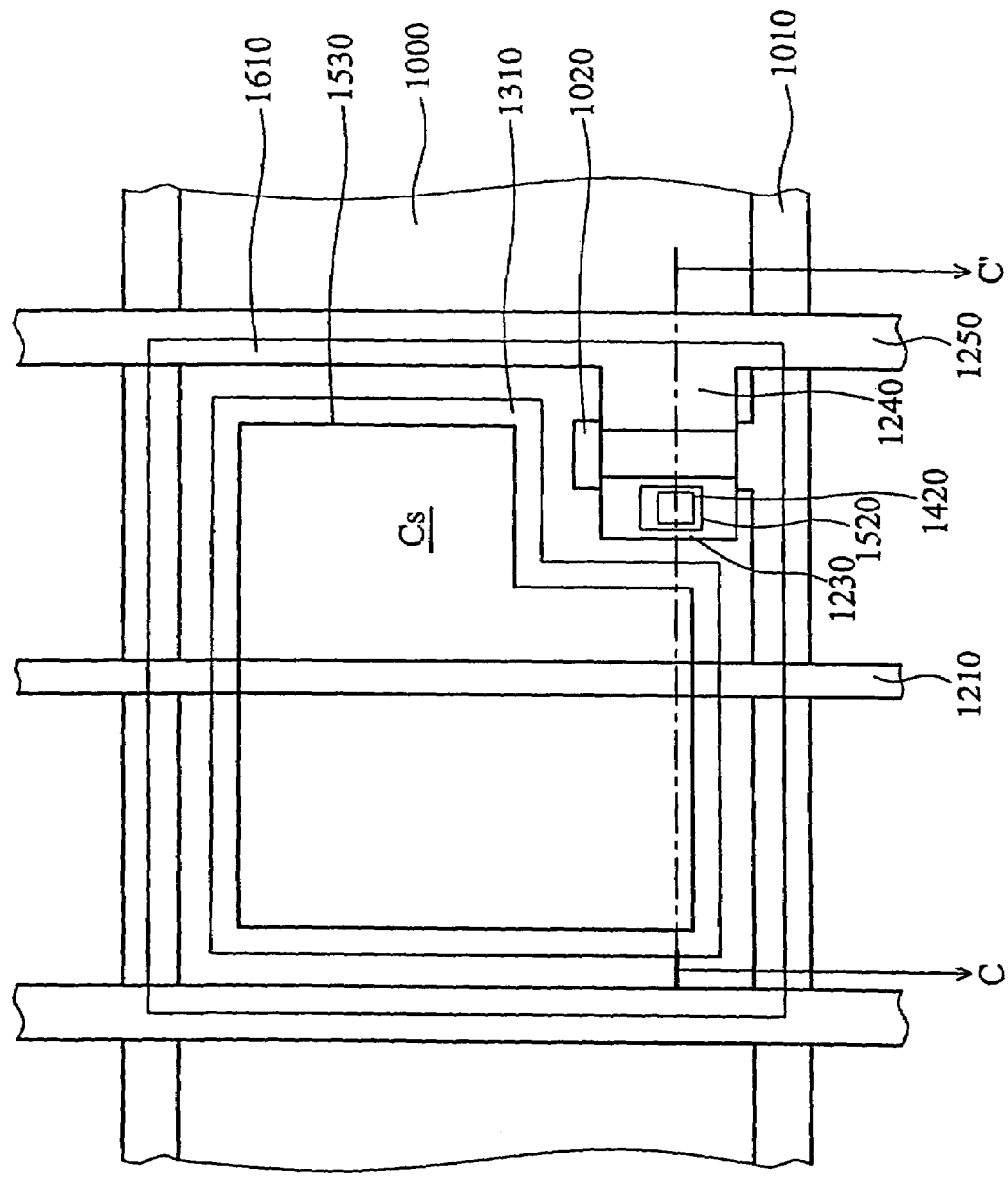

In FIGS. 16A and 16B, by deposition and a sixth photolithography (PEP VI), a conformal third conductive layer 1610 is formed on part of the planarization layer 1510 and electrically connects the source electrode 1230. The third conductive layer 1610 may be indium tin oxide (ITO) or indium zinc oxide (IZO) formed by deposition, serving as a top electrode or a charge collector electrode. Thus, a storage capacitor structure Cs composed of the second conductive layer 1310, the passivation layer 1410 and the third conductive layer 1610 in the capacitor area 1001 is obtained.

In comparison with the prior art, the present invention has following advantages. For example, the dielectric layer of the storage capacitor Cs is different from the gate insulation layer of the TFT and can thus fit the demands of different materials or thicknesses. The storage capacitor Cs is disposed above the common line, thereby reducing device size. Since the bottom electrode (a pixel electrode) does not connect the underside of the common line, the method of the invention is suitable for gray-tone photolithography of the TFT. Additionally, because the passivation simultaneously serves as the dielectric layer of the capacitor Cs and the protection layer for the TFT's channel, the method of the invention does not need an extra photolithography to form the protection layer, thereby decreasing costs and ameliorating the disadvantages of the prior art.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A method of fabricating an X-ray detector, comprising the steps of:
    providing a substrate having a capacitor area and a transistor area;
    forming a common line over the capacitor area and an array of semiconductor-based switching elements over the transistor area;
    forming a first conductive layer over the capacitor area covering and contacting the common line;
    forming and patterning a conformal passivation layer to expose a portion of the semiconductor-based switching elements;
    forming and then patterning a planarization layer to expose a portion of semiconductor-based switching elements in the transistor area and a portion of the passivation layer in the capacitor area; and
    forming a conformal second conductive layer on the patterned planarization layer, wherein the second conductive layer, the first conductive layer and the passivation layer in the capacitor area constitute a storage capacitor structure.

2. The method as claimed in claim 1, wherein the semiconductor-based switching elements comprises a plurality of thin film transistors formed over the transistor area, wherein each of the thin film transistors comprises a drain electrode connected to a data line, a gate electrode connected to a gate line and a source electrode connected to the second conductive layer.

3. The method as claimed in claim 2, further comprising a step of forming a gate insulation layer over the gate lines.

4. A method of fabricating an X-ray detector, comprising the steps of:
    providing a substrate having a capacitor area and a transistor area;
    forming a common line over the capacitor area, an array of semiconductor-based switching elements, and corresponding address lines over the transistor area, wherein the semiconductor-based switch elements comprises a plurality of thin film transistors formed over the transistor area, and each of the thin film transistors comprises a drain electrode, a gate electrode and a source electrode;
    forming a first conductive layer covering and contacting the common line in the capacitor area;
    forming a passivation layer on the transistors and the first conductive layer, wherein the passivation layer exposes a portion of the source electrode; and
    forming a planarization layer over the substrate, wherein the planarization layer is then patterned to expose a portion of the source electrode in the transistor area and a portion of the passivation layer in the capacitor area.

5. The method as claimed in claim 4, wherein the corresponding address lines comprise gate lines and data lines.

6. The method as claimed in claim 5, wherein each of the drain electrode is connected to the data line, and each of the gate electrode is connected to the gate line.

7. The method as claimed in claim 5, further comprising a step of forming a gate insulation layer over the gate lines in the transistor area.

8. The method as claimed in claim 4, further comprising a step of forming a second conductive layer conformal to the planarization layer and the exposed passivation layer, wherein the second conductive layer contacts the exposed source electrode, and wherein the second conductive layer, the passivation layer and the first conductive layer in the capacitor area together form a capacitor.

\* \* \* \* \*